US 6,594,414 B2

(12) United States Patent
Tungare et al.

(10) Patent No.: US 6,594,414 B2
(45) Date of Patent: Jul. 15, 2003

(54) STRUCTURE AND METHOD OF FABRICATION FOR AN OPTICAL SWITCH

(75) Inventors: Aroon Tungare, Winfield, IL (US); Keryn Lian, Palatine, IL (US); Robert Lempkowski, Elk Grove, IL (US); Barbara Foley Barenburg, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/911,492

(22) Filed: Jul. 25, 2001

(65) Prior Publication Data

US 2003/0021520 A1 Jan. 30, 2003

(51) Int. Cl.⁷ .............................. G02B 6/26; G02B 6/42
(52) U.S. Cl. .............................. 385/18; 385/16; 385/14; 438/22; 438/29; 438/31
(58) Field of Search .............................. 385/14, 16, 18, 385/88–94, 31, 32, 33, 34; 438/22, 29, 31

(56) References Cited

U.S. PATENT DOCUMENTS

| 3,670,213 A | 6/1972 | Nakawaga et al. | 317/234 |
| 3,766,370 A | 10/1973 | Walther | 235/156 |
| 3,802,967 A | 4/1974 | Ladany et al. | 148/171 |
| 4,006,989 A | 2/1977 | Andringa | 356/106 |
| 4,284,329 A | 8/1981 | Smith et al. | 350/375 |
| 4,398,342 A | 8/1983 | Pitt et al. | 29/580 |
| 4,404,265 A | 9/1983 | Manasevit | 428/689 |
| 4,424,589 A | 1/1984 | Thomas et al. | 382/61 |
| 4,482,906 A | 11/1984 | Hovel et al. | 357/16 |
| 4,484,332 A | 11/1984 | Hawrylo | 372/50 |
| 4,523,211 A | 6/1985 | Morimoto et al. | 357/4 |
| 4,667,088 A | 5/1987 | Kramer et al. | 235/380 |
| 4,756,007 A | 7/1988 | Qureshi et al. | 375/37 |
| 4,772,929 A | 9/1988 | Manchester | 257/422 |

(List continued on next page.)

FOREIGN PATENT DOCUMENTS

| DE | 197 12 496 | 10/1997 | ......... H01L/41/107 |
| DE | 100 17 137 | 10/2000 | ......... H01L/21/203 |
| EP | 0 205 171 | 12/1987 | ........... H01L/21/82 |
| EP | 0 331 467 | 9/1989 | ........... H01L/21/20 |
| EP | 3 342 937 | 11/1989 | ........... H01L/21/20 |
| EP | 0 455 526 | 6/1991 | ........... H01L/21/20 |
| EP | 0 514 018 | 11/1992 | ........... H01L/21/20 |
| EP | 0 602 568 | 6/1994 | ......... H01L/21/314 |

(List continued on next page.)

OTHER PUBLICATIONS

Nakagawara et al., Effects of Buffer Layers in Epitaxial Growth of $SrTiO_3$ Thin Film on Si(100), *J. Appl. Phys.*, 78 (12), Dec. 15, 1995, pp. 7226–7230.

(List continued on next page.)

*Primary Examiner*—Brian Healy
*Assistant Examiner*—Kevin S. Wood
(74) *Attorney, Agent, or Firm*—Oblon, Spivak, McClelland, Maier & Neustadt, P.C.

(57) ABSTRACT

A structure for an optical switch includes a reflective layer formed over a high quality epitaxial layer of piezoelectric compound semiconductor materials grown over a monocrystalline substrate, such as a silicon wafer. The piezoelectric layer can be activated to alter the path of light incident on the reflective layer. A compliant substrate is provided for growing the monocrystalline compound semiconductor layer. An accommodating buffer layer comprises a layer of monocrystalline oxide spaced apart from a silicon wafer by an amorphous interface layer of silicon oxide. The amorphous interface layer dissipates strain and permits the growth of a high quality monocrystalline oxide accommodating buffer layer. The accommodating buffer layer is lattice matched to both the underlying silicon wafer and the overlying piezoelectric monocrystalline material layer.

44 Claims, 13 Drawing Sheets

U.S. PATENT DOCUMENTS

| | | | | |
|---|---|---|---|---|
| 4,777,613 A | 10/1988 | Shahan et al. | ............... | 364/478 |
| 4,793,872 A | 12/1988 | Meunier et al. | ............ | 148/33.4 |
| 4,802,182 A | 1/1989 | Thornton et al. | ............. | 372/50 |
| 4,815,084 A | 3/1989 | Scifres et al. | .................. | 372/46 |
| 4,841,775 A | 6/1989 | Ikeda et al. | .................... | 73/704 |
| 4,845,044 A | 7/1989 | Ariyoshi et al. | ............ | 438/489 |
| 4,855,249 A | 8/1989 | Akasaki et al. | ............... | 437/81 |
| 4,868,376 A | 9/1989 | Lessin et al. | ............... | 235/492 |
| 4,876,219 A | 10/1989 | Eshita et al. | ................ | 437/126 |
| 4,882,300 A | 11/1989 | Inoue et al. | ................ | 437/236 |
| 4,891,091 A | 1/1990 | Shastry | ........................ | 156/606 |
| 4,896,194 A | 1/1990 | Suzuki | ........................ | 357/16 |
| 4,912,087 A | 3/1990 | Aslam et al. | ............... | 505/475 |
| 4,928,154 A | 5/1990 | Umeno et al. | ................. | 357/16 |
| 4,963,508 A | 10/1990 | Umeno et al. | ................ | 437/132 |
| 4,963,949 A | 10/1990 | Wanlass et al. | ................. | 357/4 |
| 4,999,842 A | 3/1991 | Huang et al. | ................. | 372/45 |
| 5,055,445 A | 10/1991 | Belt et al. | ........................ | 505/1 |
| 5,060,031 A | 10/1991 | Abrokwah et al. | ......... | 257/274 |
| 5,063,166 A | 11/1991 | Mooney et al. | ................ | 437/22 |
| 5,081,062 A | 1/1992 | Vasudev et al. | ............. | 437/132 |
| 5,116,461 A | 5/1992 | Lebby et al. | ................ | 156/643 |
| 5,127,067 A | 6/1992 | Delcoco et al. | ................ | 385/24 |
| 5,141,894 A | 8/1992 | Bisaro et al. | ................ | 437/132 |
| 5,144,409 A | 9/1992 | Ma | ........................... | 357/61 |
| 5,155,658 A | 10/1992 | Inam et al. | .................. | 361/321 |
| 5,159,413 A | 10/1992 | Calviello et al. | ............... | 505/1 |
| 5,173,474 A | 12/1992 | Connell et al. | .................. | 505/1 |
| 5,185,589 A | 2/1993 | Krishnaswamy et al. | ... | 333/133 |
| 5,194,397 A | 3/1993 | Cook et al. | .................... | 437/31 |
| 5,221,367 A | 6/1993 | Chisholm et al. | ............. | 148/33 |
| 5,225,031 A | 7/1993 | McKee et al. | ............... | 156/612 |
| 5,248,564 A | 9/1993 | Ramesh | ........................ | 428/688 |
| 5,270,298 A | 12/1993 | Ramesh | .......................... | 505/1 |
| 5,286,985 A | 2/1994 | Taddiken | .................... | 257/200 |
| 5,293,050 A | 3/1994 | Chapple-Sokol et al. | ..... | 257/17 |
| 5,310,707 A | 5/1994 | Oishi et al. | ................. | 501/126 |
| 5,314,547 A | 5/1994 | Heremans et al. | ......... | 148/33.1 |
| 5,326,721 A | 7/1994 | Summerfelt | ................. | 437/131 |
| 5,356,831 A | 10/1994 | Calviello et al. | ............ | 437/110 |
| 5,358,925 A | 10/1994 | Neville Connell et al. | . | 505/235 |
| 5,367,585 A | * 11/1994 | Chezzo et al. | .................. | 385/2 |
| 5,371,734 A | 12/1994 | Fischer | ......................... | 370/18 |
| 5,391,515 A | 2/1995 | Kao et al. | ..................... | 437/133 |
| 5,393,352 A | 2/1995 | Summerfelt | ............... | 148/33.3 |
| 5,404,581 A | 4/1995 | Honjo | ......................... | 455/90 |
| 5,405,802 A | 4/1995 | Yamagata et al. | ............. | 437/71 |
| 5,406,202 A | 4/1995 | Mehrgardt et al. | .......... | 324/251 |
| 5,418,216 A | 5/1995 | Fork | ........................ | 505/473 |
| 5,418,389 A | 5/1995 | Watanabe | .................... | 257/295 |
| 5,436,759 A | 7/1995 | Dijaili et al. | ................. | 359/333 |
| 5,442,191 A | 8/1995 | Ma | ............................... | 257/1 |
| 5,442,561 A | 8/1995 | Yoshizawa et al. | ......... | 364/468 |
| 5,444,016 A | 8/1995 | Abrokwah et al. | ......... | 437/184 |
| 5,450,812 A | 9/1995 | McKee et al. | ................ | 117/84 |
| 5,453,727 A | 9/1995 | Shibasaki et al. | ............ | 333/32 |
| 5,478,653 A | 12/1995 | Guenzer | .................... | 428/446 |
| 5,480,829 A | 1/1996 | Abrokwah et al. | ............ | 437/57 |
| 5,482,003 A | 1/1996 | McKee et al. | ............... | 117/108 |
| 5,491,461 A | 2/1996 | Partin et al. | ............... | 338/32 R |
| 5,492,859 A | 2/1996 | Sakaguchi et al. | ............ | 437/86 |
| 5,494,711 A | 2/1996 | Takeda et al. | .............. | 427/473 |
| 5,514,484 A | 5/1996 | Nashimoto | ................ | 428/700 |
| 5,515,047 A | 5/1996 | Yamakido et al. | .......... | 341/153 |
| 5,515,810 A | 5/1996 | Yamashita | ................... | 117/17 |
| 5,528,067 A | 6/1996 | Farb | ........................ | 257/401 |
| 5,528,414 A | 6/1996 | Oakley | ....................... | 359/257 |
| 5,556,463 A | 9/1996 | Guenzer | ....................... | 117/90 |
| 5,576,879 A | 11/1996 | Nashimoto | ................. | 359/248 |
| 5,577,137 A | * 11/1996 | Groger et al. | ................ | 385/12 |
| 5,588,995 A | 12/1996 | Sheldon | ....................... | 117/201 |
| 5,606,184 A | 2/1997 | Abrokwah et al. | ......... | 257/192 |
| 5,614,739 A | 3/1997 | Abrokwah et al. | ......... | 257/192 |
| 5,640,267 A | 6/1997 | May et al. | .................. | 359/322 |
| 5,656,382 A | 8/1997 | Nashimoto | ................ | 428/620 |
| 5,670,798 A | 9/1997 | Schetzina | ..................... | 257/96 |
| 5,674,366 A | 10/1997 | Hayashi et al. | ........ | 204/298.09 |
| 5,679,965 A | 10/1997 | Schetzina | ................... | 257/103 |
| 5,729,394 A | 3/1998 | Sevier et al. | ............... | 359/726 |
| 5,729,641 A | 3/1998 | Chandonnet et al. | .......... | 385/2 |
| 5,733,641 A | 3/1998 | Fork et al. | .................. | 428/210 |
| 5,735,949 A | 4/1998 | Mantl et al. | .................. | 117/8 |
| 5,741,724 A | 4/1998 | Ramdani et al. | ............ | 437/128 |
| 5,764,676 A | 6/1998 | Paoli et al. | .................... | 372/50 |
| 5,777,350 A | 7/1998 | Nakamura et al. | ............ | 257/96 |
| 5,778,018 A | 7/1998 | Yoshikawa et al. | ........... | 372/45 |
| 5,778,116 A | 7/1998 | Tomich | ........................ | 385/18 |
| 5,789,845 A | 8/1998 | Wadaka et al. | ............. | 310/334 |
| 5,790,583 A | 8/1998 | Ho | ............................. | 372/92 |
| 5,792,679 A | 8/1998 | Nakato | ........................ | 438/162 |
| 5,801,105 A | 9/1998 | Yano et al. | ....................... | 438/2 |
| 5,810,923 A | 9/1998 | Yano et al. | ...................... | 117/84 |
| 5,825,799 A | 10/1998 | Ho et al. | ......................... | 372/92 |
| 5,828,080 A | 10/1998 | Yano et al. | .................. | 257/43 |
| 5,830,270 A | 11/1998 | McKee et al. | ............. | 117/106 |
| 5,846,846 A | 12/1998 | Suh et al. | ........................ | 438/2 |
| 5,857,049 A | 1/1999 | Beranek et al. | ................ | 385/91 |
| 5,858,814 A | 1/1999 | Goossen et al. | ............ | 438/107 |
| 5,861,966 A | 1/1999 | Ortel | ........................ | 351/125 |
| 5,872,493 A | 2/1999 | Ella | ........................ | 333/191 |
| 5,874,860 A | 2/1999 | Brunel et al. | ................ | 330/285 |
| 5,880,452 A | 3/1999 | Plesko | ......................... | 235/472 |
| 5,883,996 A | 3/1999 | Knapp et al. | .................. | 385/88 |
| 5,912,068 A | 6/1999 | Jia | ............................... | 428/210 |
| 5,915,063 A | * 6/1999 | Colbourne et al. | ......... | 385/140 |
| 5,926,496 A | 7/1999 | Ho et al. | ......................... | 372/92 |
| 5,937,285 A | 8/1999 | Abrokwah et al. | ............ | 438/172 |
| 5,948,161 A | 9/1999 | Kizuki | ......................... | 117/89 |
| 5,959,879 A | 9/1999 | Koo | ............................. | 365/145 |
| 5,981,400 A | 11/1999 | Lo | ............................... | 438/745 |
| 5,990,495 A | 11/1999 | Ohba | ........................... | 257/94 |
| 5,995,359 A | 11/1999 | Klee et al. | .................... | 361/305 |
| 6,002,375 A | 12/1999 | Corman et al. | ............. | 343/853 |
| 6,008,762 A | 12/1999 | Nghiem | ........................ | 343/700 |
| 6,020,222 A | 2/2000 | Wollesen | .................... | 438/139 |
| 6,045,626 A | 4/2000 | Yano et al. | ................. | 148/33.4 |
| 6,046,464 A | 4/2000 | Schetzina | .................... | 259/196 |
| 6,055,179 A | 4/2000 | Koganei et al. | ............. | 365/158 |
| 6,058,131 A | 5/2000 | Pan | ............................. | 372/102 |
| 6,064,078 A | 5/2000 | Northrup et al. | ............. | 257/96 |
| 6,064,092 A | 5/2000 | Park | ............................ | 257/347 |
| 6,096,584 A | 8/2000 | Ellis-Monaghan et al. | .. | 438/151 |
| 6,103,008 A | 8/2000 | McKee et al. | .................. | 117/2 |
| 6,107,653 A | 8/2000 | Fitzgerald | .................... | 257/191 |
| 6,114,996 A | 9/2000 | Nghiem | ........................ | 343/700 |
| 6,121,642 A | 9/2000 | Newns | ........................ | 257/92 |
| 6,128,178 A | 10/2000 | Newns | ........................ | 361/305 |
| 6,136,666 A | 10/2000 | So | ............................. | 438/458 |
| 6,137,603 A | 10/2000 | Henmi | ........................ | 359/110 |
| 6,143,072 A | 11/2000 | McKee et al. | ............. | 117/108 |
| 6,146,906 A | 11/2000 | Inoue et al. | ................... | 438/3 |
| 6,173,474 B1 | 1/2001 | Conrad | ........................ | 15/351 |
| 6,174,755 B1 | 1/2001 | Manning | ..................... | 438/151 |
| 6,180,252 B1 | 1/2001 | Farrell et al. | ................ | 428/469 |
| 6,180,486 B1 | 1/2001 | Leobandung et al. | ........ | 438/405 |
| 6,184,144 B1 | 2/2001 | Lo | ............................... | 438/703 |
| 6,191,011 B1 | 2/2001 | Gilboa et al. | ................ | 438/488 |
| 6,204,737 B1 | 3/2001 | Ella | ........................ | 333/187 |
| 6,222,654 B1 | 4/2001 | Frigo | ........................ | 359/119 |
| 6,235,145 B1 | 5/2001 | Li et al. | ........................ | 156/345 |
| 6,268,269 B1 | 7/2001 | Lee et al. | .................... | 438/473 |

| | | | | |
|---|---|---|---|---|
| 6,316,832 B1 | 11/2001 | Tsuzuki et al. ............. 257/747 |
| 6,343,171 B1 | 1/2002 | Yoshimura et al. ............ 385/50 |
| 2002/0025101 A1 * | 2/2002 | Kaatz .......................... 385/14 |
| 2002/0054729 A1 * | 5/2002 | Berg et al. .................... 385/18 |

FOREIGN PATENT DOCUMENTS

| | | | |
|---|---|---|---|
| EP | 0 607 435 | 7/1994 | ........... H01L/21/20 |
| EP | 0 682 266 | 11/1995 | ........... G01R/33/09 |
| EP | 0 810 666 | 12/1997 | ......... H01L/27/115 |
| EP | 0 875 922 | 11/1998 | ........... H01L/21/20 |
| EP | 0 926 739 | 6/1999 | ........... H01L/29/51 |
| EP | 0 957 522 | 11/1999 | ......... H01L/27/115 |
| EP | 0 964 259 | 12/1999 | ........... G01R/33/07 |
| EP | 0 964 453 | 12/1999 | ........... H01L/29/51 |
| EP | 0 999 600 | 5/2000 | ......... H01L/31/232 |
| EP | 1 001 468 | 5/2000 | ........... H01L/29/51 |
| EP | 1 043 426 | 10/2000 | ........... G30B/29/16 |
| EP | 1 109 212 | 6/2001 | ......... H01L/21/316 |
| GB | 1 319 311 | 6/1970 | ............ B01J/17/30 |
| GB | 2 335 792 | 2/1999 | ........... H01L/21/20 |
| JP | 52-88354 | 7/1977 | ............. G02B/5/14 |
| JP | 52 135684 | 11/1977 | ......... H01L/21/225 |
| JP | 54-134554 | 10/1979 | ......... H01L/21/205 |
| JP | 55-87424 | 7/1980 | ........... H01L/21/20 |
| JP | 58-213412 | 12/1983 | ........... H01L/21/20 |
| JP | 60-210018 | 10/1985 | ............ H03H/9/17 |
| JP | 60-212018 | 10/1985 | ............ H03H/9/25 |
| JP | 61-63015 | 2/1986 | ........... H01L/21/20 |
| JP | 61-108187 | 5/1986 | ........... H01L/31/02 |
| JP | 63-34994 | 2/1988 | ............. H01S/3/18 |
| JP | 63-131104 | 6/1988 | ............ G02B/6/12 |
| JP | 63-198365 | 8/1988 | ........... H01L/27/04 |
| JP | 64-50575 | 2/1989 | ........... H01L/39/02 |
| JP | 64-52329 | 2/1989 | ........... H01B/12/06 |
| JP | 1-102435 | 4/1989 | ............. G02F/1/31 |
| JP | 1-179411 | 7/1989 | ......... H01L/21/205 |
| JP | HEI 2-391 | 1/1990 | ........... H01L/39/22 |
| JP | 02051220 | 2/1990 | ........... H01L/21/20 |
| JP | 3-41783 | 2/1991 | ........... H01L/39/22 |
| JP | 5-48072 | 2/1993 | ........... H01L/27/15 |
| JP | 5-152529 | 6/1993 | ......... H01L/27/092 |
| JP | 6-232126 | 8/1994 | ........... H01L/33/00 |
| JP | 6-291299 | 10/1994 | ........... H01L/27/15 |
| JP | 6-334168 | 12/1994 | ........... H01L/27/15 |
| JP | 0812494 | 1/1996 | ........... H01L/27/10 |
| JP | 9-67193 | 3/1997 | ........... G30B/29/22 |
| JP | 9-82913 | 3/1997 | ......... H01L/27/108 |
| JP | 10-256154 | 9/1998 | ........... H01L/20/21 |
| JP | 10-303396 | 11/1998 | ......... H01L/27/108 |
| JP | 10-321943 | 12/1998 | ............. H01S/3/18 |
| JP | 11135614 | 5/1999 | ........... H01L/21/76 |
| JP | 11-238683 | 8/1999 | ......... H01L/21/203 |
| JP | 11-260835 | 9/1999 | ........... H01L/21/20 |
| JP | 11340542 | 12/1999 | ........... H01L/43/08 |
| JP | 2000-068466 | 3/2000 | ........... H01L/27/10 |
| JP | 2 000 1645 | 6/2000 | ......... C09D/163/00 |
| WO | WO 92/10875 | 6/1992 | ............ H03B/5/36 |
| WO | WO 94/03908 | 2/1994 | ........... H01B/12/30 |
| WO | WO 97/45827 | 12/1997 | ........... H01L/21/20 |
| WO | WO 98/05807 | 1/1998 | ............. L30B/25/14 |
| WO | WO 99/14797 | 3/1999 | ........... H01L/27/00 |
| WO | WO 99/14804 | 3/1999 | ....... H01L/21/8258 |
| WO | WO 99/19546 | 4/1999 | ........... L30B/23/04 |
| WO | WO 99/63580 | 12/1999 | ............. H01L/3/90 |
| WO | WO 00/16378 | 3/2000 | |
| WO | WO 00/33363 | 6/2000 | ........... H01L/21/20 |
| WO | WO 00/48239 | 8/2000 | ........... H01L/21/20 |
| WO | WO 01/33585 | 5/2001 | ........... H01F/41/14 |
| WO | WO 01/37330 | 5/2001 | ......... H01L/21/316 |
| WO | WO 01/59814 A2 | 8/2001 | |
| WO | WO 02 01648 | 1/2002 | ......... H01L/31/336 |
| WO | WO 02/09160 A2 | 1/2002 | ........... H01L/21/00 |
| WO | WO 02/33385 A2 | 4/2002 | ........... G01N/21/64 |

OTHER PUBLICATIONS

W. F. Egelhoff et al., "Optimizing GMR Spin Valves: The Outlook for Improved Properties", 1998 *Int'l Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

K. Sreenivas et al., "Surface Acoustic Wave Propagation on Lead Zirconate Titanate Thin Films," *Appl. Phys. Lett.* 52 (9), Feb. 29, 1998, pp. 709–711.

M. Rotter et al., "Single Chip Fused Hybrids for Acousto–Electric and Acousto–Optic Applications," 1997 *Applied Physics Letters*, vol. 70(16), Apr. 21, 1997, pp. 2097–2099.

A. Mansingh et al., "Surface Acoustic Wave Propagation in PZT/YBCO/SrTiO$_3$ and PbTiO$_3$/YBCO/SrTiO$_3$ Epitaxial Heterostructures," *Ferroelectric*, vol. 224, pp. 275–282, 1999.

S. Mathews et al., "Ferroelectric Field Effect Transisitor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S. F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884–1886.

Ringel et al., "Epitaxial Integration of III–V Materials and Devices with Si Using Graded GeSi Buffers," 27th International Symposium on Compound Semiconductors, Oct. 2000.

Zogg et al., "Progress in Compound–Semiconductor–on–Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates,"*IEEE Photonics Technology Letters*, vol. 12, No. 2, Feb. 2000, pp. 110–112.

Gunapala et al.,"Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 211–224.

Bruley et al., "Nanostructure and Chemistry of a (100)MgO(100) GaAs Interface," *Appl. Phys Lett*, 65(5), Aug. 1994, pp. 564–566.

Fork et al., "Epitaxial MgO On Si(001) for Y–Ba–Cu–O Thin Film Growth by Pulsed Laser Deposition," *Appl. Phys Lett*, 58(20), May 20, 1991, pp. 2294–2296.

Himpsel et al., "Dialectrics on Semiconductors," *Materials Science and Engineering*, B1(1988), pp. 9–13.

Mikami et al., "Formation of Si Epi/MgO–Al$_2$O$_3$Epi./SiO$_3$/Si and Its Epitaxial Film Quality," Fundamental Research Laboratories and Microelectronics Laboratories, pp. 31–34, 1983.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

T. Mizuno, et al.; "Electron and Hole Mobility Enhancement in Strained–Si MOSFET's on SiGe–on–Insulator Substrates Fabricated by SIMOX Technology"; IEEE ELECTRON DEVICE LETERS, vol. 21, No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, $7^{th}$ Int'l Workshop on, 2000; pp. 64–65.

Mau–Chung Frank Chang, et al.; "RF/Wireless Interconnect for Inter–and Intra–Chip Communications"; Proceedings of the IEEE, vol.89, No. 4, Apr. 2001; pp. 456–466.

The Electronics Industry Report; Prismark; 2001; pp. 111–120 (No Date).

Nagata et al., "Heteroepitaxial Growth of $CeO_2$(001) Films on Si(001) Substrates by Pulsed Laser Deposition in Ultrahigh Vacuum," Jpn. Jour. Appl. Phys., vol. 30, No. 6B, Jun. 1991, pp. L1136–L1138.

J.K. Abrokwah, et al.; "A Manufacturable High–Speed Low– Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993; pp. 67–150.

Jayshri Sabarinathat, et al.; "Submicron three–dimensionsl infrared $GaAs/Al_xO_y$–based photonic crystal using single–step epitaxial growth"; Applied Physics Letters, vol. 78, No. 20, May 14, 2001; pp.3024–3026.

Philip Ball; "The Next Generation of Optical Fibers"; Technology Review, May 2001; pp.55–61.

John D. Joannopoulos, et al.; "Moulding the Flow of Light"; Photonics Crystals; Princeton Unversity Press, 1995.

Thomas F. Krauss, et al.; "Photonic crystals in the optical regime –past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6. Jun. 2000; pp.807–812.

D.E. Aspnes, et al.; "Steps on (001) silicon surfaces"; J. Vac. Sci. Technol. B, vol. 5, No. 4, Jul./Aug. 1987; pp. 939–944.

D.M. Newns, et al.; "Mott Transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Shichijo, et al., "Co–Integration of GaAs MESFET and Si CMOS Circuits"; IEEE Electron Device Letters, vol. 9, No. 9, Sep. 1988; pp. 444–446.

Z.H. Zhu, et al. "Growth of InGaAs multi–quantum wells at 1.3 m wavelength on GaAs compliant substrates"; Applied Physics Letters, vol. 72, No. 20, May 18, 1998; pp.2598–2600.

Kurt Eisenberger, et al.; "Metamorphic InAlAs/InGaAs Enhancement Mode HEMT's on GaAs Substrates"; IEEE Electron Device Letters, vol. 20, No. 10, Oct. 1999; pp. 507–509.

R.D. Vispute; "High quality optoelectronic grade epitaxial AlN films on $–Al_2O_3$, Si and 6H–SiC by pulsed laser deposition"; Thin Solid Films 299 (1997), pp. 94–103.

T. Warren Weeks, et al.; "GaN thin films deposited via organomettalic vapor phase epitaxy on (6H)–SiC(0001) using high–temperature monocrystalline AlN buffer layers" 320 Applied Physics Letters, vol. 67, No. 3, Jul. 17, 1995, pp. 1401–403.

Z. Yu, et al.; "Epitaxial oxide thin films on SI(001)*"; J. Vac. Sci. Technol. B. vol. 18, No. 4, Jul./Aug. 2000; pp. 2139–2145.

Gentex Corporate Website; Photoelectric Smoke Detectors – How They Work; 2001.

Jeffrey B. Casady, et al.; "A Hybrid 6H–SiC Temperature Sensor Operational from 25 C to 500 C"; IEEE Transactions on Components, Packaging, and Manufacturing Technology –Part A, vol. 19, No. 3, Sep. 1996; pp. 416–422.

Ronald W. Waynant, et al.; "Optoelectronic Integrated Circuits"; Electro–Optics Handbook, McGraw–Hill, Inc., Chapter Twenty Seven.

Antonio Mecozzi, et al.; "The Roles of Semiconductor Optical Amplifiers in Optical Networks"; Optics & Photonics News; Mar. 2001; pp. 37–42.

Peter S. Guilfoyle, et al.; "Optoelectronic Architecture for High–Speed Switching and Processing Applications"; 1998 The Photonics Design and Applications Handbook; pp. H–399–H–406.

Gerald B. Stringfellow; "Organometallic Vapor–Phase Epitaxy: Theory and Practice"; Departments of Materials Science and Engineering and Electrical Engineering, University of Utah; Academic Press, 1989.

GaInAs Superconducting FET, IBM Technical Bulletin, vol. 36, No. 8, Aug. 1993, pp. 655–656.

"Epitaxial 3d Structure Using Mixed Spinels," IBM Technical Bulletin, vol. 30, No. 3, Aug. 1987, p. 1271.

Yodo et al., GaAs Heteroepitaxial Growth on Si Substrates with Thin Si Interlayers in situ Annealed at High Temperatures, 8257b Journal of Vacuum Science & Technology, 1995 May/Jun., vol. 13, No. 3, pp. 1000–1005.

Cuomo et al., "Substrate Effect on the Superconductivity of $YbA_2Cu_3O_7$ Thin Films," AIP Conference 1988, pp. 141–148.

McKee et al., "Crystalline Oxides on Silicon: The First Five Monolayers," Physical Review Letters, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," 1991 American Institute of Physics, pp. 782–784, Aug. 13, 1991.

Tambo et al., Molecular Beam Epitaxy Growth of $SrTiO_3$ Films on Si (100)–2x1 with SrO Buffer Layer, Jpn. J. Appl. Phys., vol. 37, 1998, pp. 4454–4459.

McKee et al., "The MBE Growth and Optical Quality of $BaTiO_3$ and $SrTiO_3$ Thin Films on MgO," Mat. Res. Soc. Symp. Proc., vol. 341, Apr. 1994, pp. 309–314.

McKee et al., "$BaSi_2$ Thin Film Alkaline Earth Silicides on Silicon," Appl. Phys. Lett., 63 (20), Nov. 1993, pp. 2818–2820.

McKee et al., "Surface Structures and the Orthorhombic Transformation of Thin Film $BaSi_2$ on Silicon," Mat. Res. Soc. Symp. Proc., vol. 22, pp. 131–136.

Moon et al., "Growth of Crystalline $SrTiO_3$ Films on Si Substrates Using Thin Fluoride Buffer Layers and Their Electrical Properties," Jpn. J. Appl. Phys., vol. 33, (1994), pp. 5911–5916.

Farrow et al., "Heteroapitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices,"*Mat. Res. Soc.*, Symposium Proceedings, vol. 116, pp. 369–374, Apr. 5–8, 1988.

Douglas B. Chrisey, et al; Pulsed Laser Deposition on Thin Films; pp. 273–285 (No Date).

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu e al.; "Molecular Beam Epitaxy of GaAs on Si–on–Insulator"; 320 Applied Physics Letters 59(1991) Jul. 8 No. 2; pp. 210–212.

Umesh K. Mishra et al; "Oxide Based Compound Semiconductor Electronics"; Electron Devices Meeting; 1997; Technical Digest, International; Washington, D.C.; Dec. 7–10, 1997; pp. 545–548.

J. M. Daughton et al.; "Applications of Spin Dependent Transport Materials"; J. Phys. D. Appl. Phys. 32(1999) R169–R177 Sep. 16, 1999.

Q.–Y. Tong et al.; "IOS–a new type of materials combination for system–on–a chip preparation"; 1999 IEEE International SOI Conference, Oct. 1999; pp. 104–105.

T. Kanniainen et al.; "Growth of Dielectric 1hfo2/Ta205 Thin Film Nanolaminate Capacitors by Atomic Layer Epitaxy"; Electrochemical Society Proceedings, U.S. Electrochemical Society; Pennington, N.J.; Aug. 31, 1997; pp. 36–46.

R. Ramesh; "Ferroelectric La–Sr–Co–O/Pb–Zr–Ti–O/La–Sr–Co–O Heterostructures on Silicon via Template Growth"; 320 Applied Physics Letters; 63(1993); Dec. 27; No. 26; pp. 3592–3594.

K. Eisenbeiser; "Field Effect Transistors with $SrTiO_3$ Gate Dielectric on Si"; Applied Physics Letters; vol. 76, No. 10; Mar. 6, 2000; pp. 1324–1326.

Takeshi Obata; "Tunneling Magnetoresistance at Up to 270 K in $La_{0.8}Sr_{0.2}MnO_3/La_{0.8}Sr_{0.2}MnO_3$ Junctions with 1.6–nm–Thick Barriers"; Applied Physics Letters; vol. 74, No. 2, Jan. 11, 1999; pp. 290–292.

Ladsilav Pust et al.; "Temperature Dependence of the Magnetization Reversal in Co(fcc)–BN–Co(poly hcp) Structures"; Journal of Applied Physics; vol. 85, No. 8, Apr. 15, 1999; pp. 5765–5767.

Wen–Ching Shih et al.; "Theoretical Investigation of the SAW Properties of Ferroelectric Film Composite Structures"; IEEE Transactions of Ultrasonics, Ferroelecrics, and Frequency Control; vol. 45, No. 2; Mar. 1998; pp, 305–316.

Zhu Dazhong et al.; "Desing of $ZNO/SiO_2/Si$ Monolithic Integrated Programmable SAW Filter"; Proceedings of the Fifth International Conference on Solid–State and Integrated Circuit Technology; 21–23; Oct. 1998; pp. 826–829.

Fathimulla et al.; "Monolithic Integeration of InGaAs/InAlAs MODFETs and RTDs on InP–bonded–to Si Substrate"; Fourth International Conference on Indium Phosphide and Related Materials, Newport, RI, USA; Apr. 21–24, 1992 ; pp. 167–170; XP000341253; IEEE, New York, NY, USA; ISBN: 0–7803–0522–1.

H. Takahashi et al.; "Arraryed–Waveguide Grating For Wavelength Division Multi/Demultiplexer With Nanometre Resolution"; Electronics Letters; vol. 26., No. 2, Jan. 18, 1990.

M. Schreiter, et al.; "Sputtering of Self–Polarized PZT Films for IR–Detector Arrays"; 1998 IEEE; pp. 181–185.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid State Electronic Devices"; 1990, Prentice Hall; Third Edition; pp. 320–322.

S.N. Subbarao et al.; "Monolithic PIN Photodetector and FET Amplifier on GaAs–os–Si"; IEEE; GaAs IC Symposium–163–166; 1989.

Chenning Hu et al.; Solar Cells From Basics to Advanced Systems; McGraw–Hill Book Company; 1983.

O.J. Painter et al.; "Room Temperature Photonic Crystal Defect Lasers at Near–Infrared Wavelengths in InGaAsp"; Journal of Lightwave Technology, vol. 17, No. 11; Nov. 1999.

Don W. Shaw; "Epitaxial GaAs on Si: Progress and Potential Applications"; Mat. Res. Soc. Symp. Proc.; pp. 15–30, 1987.

P.J. Borrelli et al.; "Compositional and Structural Properties of Sputtered PLZT Thin Films"; Ferroelectric Thin Films II Symposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al; "Studies on acousto–optical interaction in SrTiO3/BaTiO3/SrTiO3 epitaxial thin film heterostructures"; J. Phys. D: Appl. Phys. 32 (1999) 380–387.

* cited by examiner

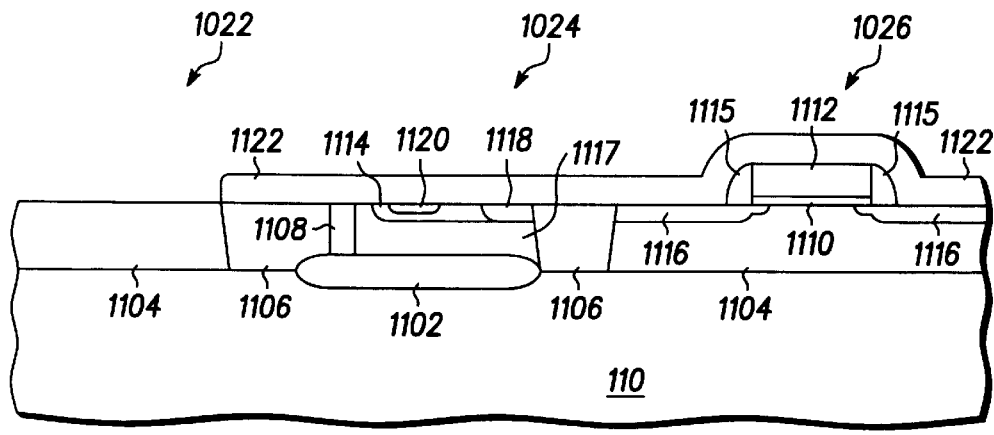
103 *FIG. 26*
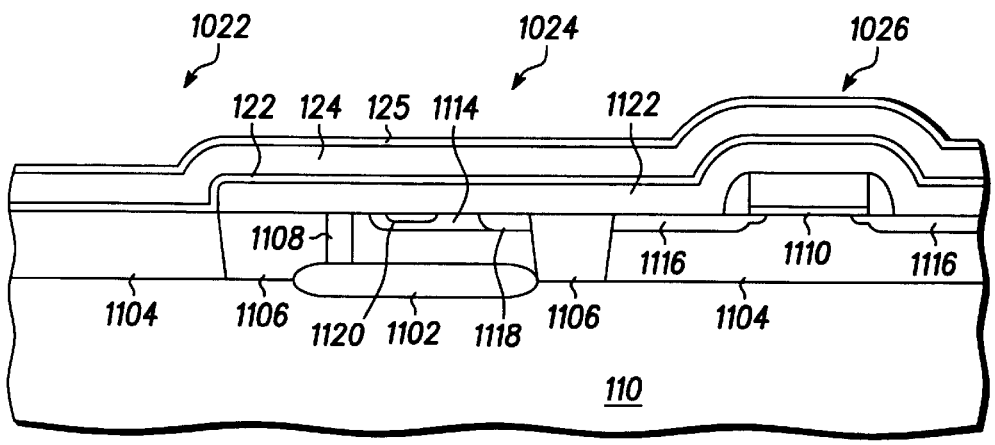
103 *FIG. 27*
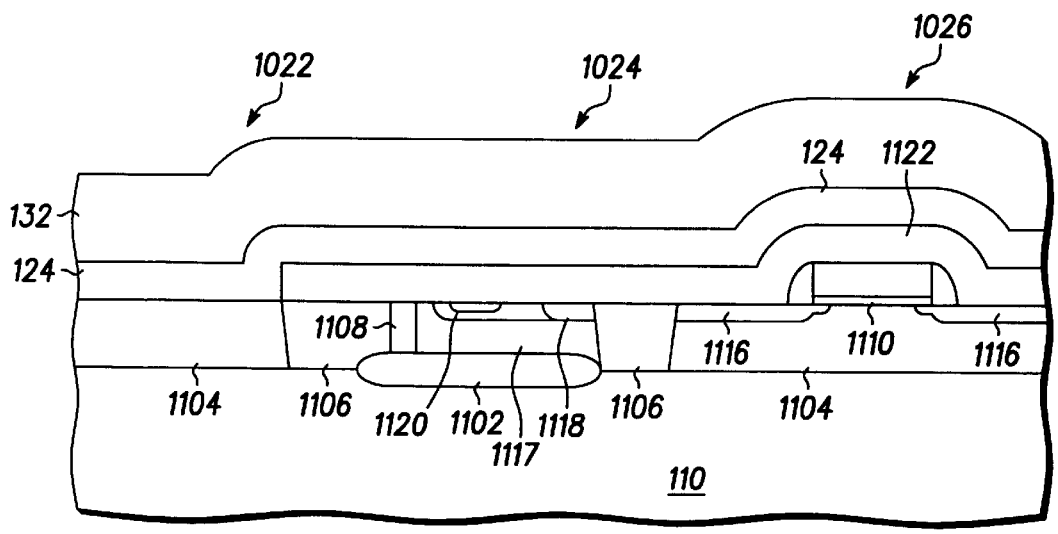
103 *FIG. 28*

STRUCTURE AND METHOD OF FABRICATION FOR AN OPTICAL SWITCH

FIELD OF THE INVENTION

This invention relates generally to semiconductor structures and devices and to methods for their fabrication. More specifically the invention relates to the fabrication and use of semiconductor structures, devices, and integrated circuits that include optical switching devices.

BACKGROUND OF THE INVENTION

Semiconductor devices often include multiple layers of conductive, insulating, and semiconductive layers. Often, the desirable properties of such layers improve with the crystallinity of the layer. For example, the electron mobility and band gap of semiconductive layers improves as the crystallinity of the layer increases. Similarly, the free electron concentration of conductive layers and the electron charge displacement and electron energy recoverability of insulative or dielectric films improves as the crystallinity of these layers increases. Further, improvement to the phenomenon of piezoelectricity occurs with improvements in crystallinity of the layer. A monocrystalline piezoelectric layer exhibits greater piezoelectric effect compared to polycrystalline films of the same or similar material. Therefore, structures including this monocrystalline film are capable of producing a stronger electronic signal per amount of deformation in the film, and conversely, exhibit greater deformation per amount of electric field applied to the film.

For many years, attempts have been made to grow various monolithic thin films on a foreign substrate such as silicon (Si). To achieve optimal characteristics of the various monolithic layers, however, a monocrystalline film of high crystalline quality is desired. Attempts have been made, for example, to grow various monocrystalline layers on a substrate such as germanium, silicon, and various insulators. These attempts have generally been unsuccessful because lattice mismatches between the host crystal and the grown crystal have caused the resulting layer of monocrystalline material to be of low crystalline quality.

If a large area thin film of high quality monocrystalline material was available at low cost, a variety of semiconductor devices could advantageously be fabricated in or using that film at a low cost compared to the cost of fabricating such devices beginning with a bulk wafer of semiconductor material or in an epitaxial film of such material on a bulk wafer of semiconductor material. In addition, if a film of high quality monocrystalline material could be realized beginning with a bulk wafer such as a silicon wafer, an integrated device structure could be achieved that took advantage of the best properties of both the silicon and the high quality monocrystalline material.

Further, if the film of high quality monocrystalline material were to provide for piezoelectric qualities, various applications could benefit. Piezoelectric qualities permit a material to bend, expand or contract when an electric field is applied thereto. Nanoengineering, surface acoustic wave, and optics are some of the areas that would benefit from increased quality of piezoelectric components.

Accordingly, a need exists for a semiconductor structure that provides a high quality piezoelectric film or layer and for a process for making such a structure. In other words, there is a need for providing the formation of a monocrystalline substrate that is compliant with a high quality monocrystalline material layer so that true two-dimensional growth can be achieved for the formation of quality semiconductor structures, devices and integrated circuits having grown monocrystalline film having the same crystal orientation as an underlying substrate. This monocrystalline material layer may be comprised of a semiconductor material, a compound semiconductor material, a piezoelectric material and other types of material such as metals and non-metals.

BRIEF DESCRIPTION OF THE DRAWINGS

The present invention is illustrated by way of example and not limitation in the accompanying figures, in which like references indicate similar elements, and in which:

FIGS. 26–30 include illustrations of cross-sectional views of a portion of an integrated circuit that includes a compound semiconductor portion, a bipolar portion, and a MOS portion that can be used in accordance with various embodiments of the invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
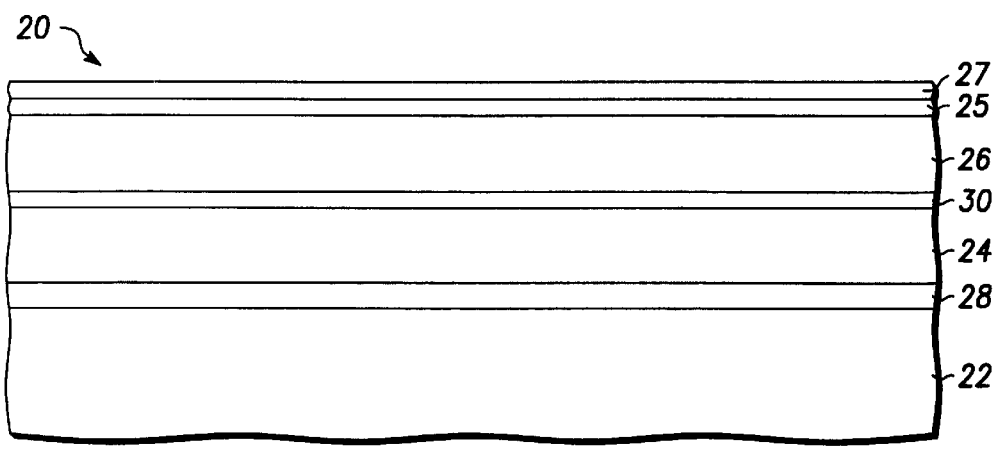
FIGS. 1, 2, and 3 illustrate schematically, in cross-section, device structures usable with optical switches in accordance with various embodiments of the invention.

FIG. 1 illustrates schematically, in cross-section, a portion of a semiconductor structure 20 usable for an optical switch. Semiconductor structure 20 includes a monocrystalline substrate 22, accommodating buffer layer 24 comprising a monocrystalline material, a monocrystalline material layer 26, a piezoelectric material layer 25, and a reflective layer 27. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

Structure 20 also includes an amorphous intermediate layer 28 positioned between substrate 22 and accommodating buffer layer 24. Structure 20 may also include a template layer 30 between the accommodating buffer layer and monocrystalline material layer 26. As will be explained more fully below, the template layer helps to initiate the growth of the monocrystalline material layer on the accommodating buffer layer. The amorphous intermediate layer helps to relieve the strain in the accommodating buffer layer and by doing so, aids in the growth of a high crystalline quality accommodating buffer layer.

Substrate 22 is a monocrystalline semiconductor or compound semiconductor wafer, preferably of large diameter. The wafer can be of, for example, a material from Group IV of the periodic table. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate.

Amorphous intermediate layer 28 can be grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, would make it difficult to achieve a high quality crystalline structure in monocrystalline material layer 26 which may comprise a semiconductor material, a compound semiconductor material, a piezoelectric semiconductor material, or another type of material such as a metal or a non-metal and may or may not have piezoelectric properties.

Accommodating buffer layer 24 is preferably a monocrystalline oxide or nitride material selected for its crystalline compatibility with the underlying substrate and with the overlying material layer. For example, the material could be an oxide or nitride having a lattice structure closely matched to the substrate and to the subsequently applied monocrystalline material layer. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitrides may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The material for monocrystalline material layer 26 can be selected, as desired, for a particular structure or application. For example, the monocrystalline material of layer 26 may comprise a compound semiconductor which can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like.

In accordance with one embodiment of the invention, the piezoelectric layer 25 is omitted and the reflective layer 27 is formed on the monocrystalline layer 26. In this embodiment, the piezoelectric characteristics of the monocrystalline material 26 are relied upon to operate the optical switch. Piezoelectric semiconductor materials, such as GaAlAs and GaAs, can be used. GaAlAs has better piezoelectric performance then GaAs, and is therefore preferable for use as a piezoelectric semiconductor material.

Monocrystalline material layer 26 may also comprise other piezoelectric or non-piezoelectric semiconductor materials, metals, or non-metal materials, which are used in the formation of semiconductor structures, devices and/or integrated circuits.

Appropriate materials for template 30 are discussed below. Suitable template materials chemically bond to the surface of the accommodating buffer layer 24 at selected sites and provide sites for the nucleation of the epitaxial growth of monocrystalline material layer 26. When used, template layer 30 has a thickness ranging from about 1 to about 10 monolayers.

The piezoelectric layer 25 can consist of piezoelectric ceramic materials or semiconductor materials. Examples of piezoelectric ceramics usable in the layer 25 include, but are not limited to Barium Titanate $BaTiO_3$, Lead Titanate $PbTiO_3$, Potassium Niobate $PbNb_2O_6$, and Lead Zirconate Titanate PZT.

The reflective layer 27 can be any suitable material for reflecting light incident on its upper surface. The material can be selected to reflect desired wavelengths, such as infrared, visible, ultraviolet, or other bandwidths.

In accordance with an embodiment of the invention, the reflective layer 27 is a 10 metal, such as aluminum, that is sputter deposited on the piezoelectric layer 25. Alternatively, the layer 27 may be a metal sheet that is attached to the piezoelectric layer 25 using a suitable adhesive. In a further embodiment, the reflective layer 27 is a mirror made of alternating layers of GaAlAs and GaAs, as described in connection with FIGS. 33–34.

Figure 2:
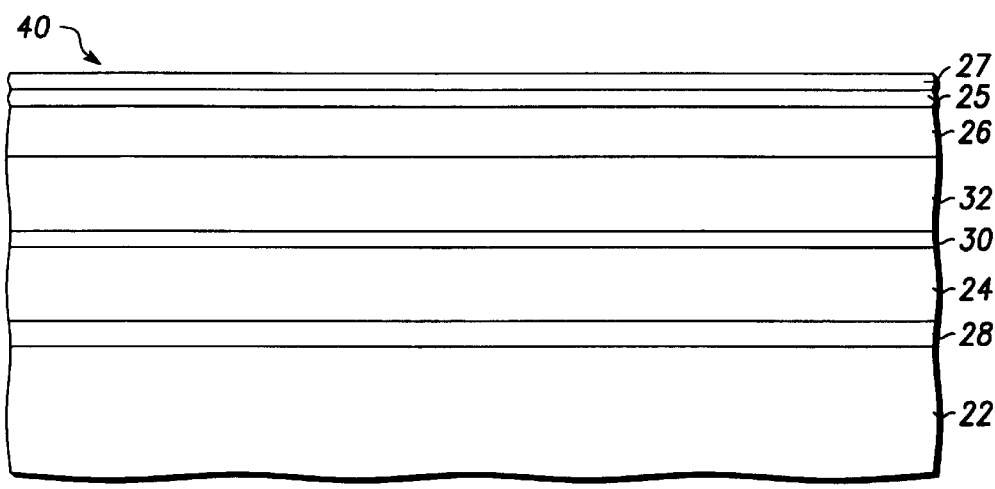

FIG. 2 illustrates, in cross-section, a portion of another semiconductor structure 40 usable with optical switches. Structure 40 is similar to the previously described semiconductor structure 20, except that an additional buffer layer 32 is positioned between accommodating buffer layer 24 and monocrystalline material layer 26. Specifically, the additional buffer layer is positioned between template layer 30 and the overlying layer of monocrystalline material. The additional buffer layer, formed of a semiconductor or compound semiconductor material when the monocrystalline material layer 26 comprises a semiconductor or compound semiconductor material, serves to provide a lattice compensation when the lattice constant of the accommodating buffer layer cannot be adequately matched to the overlying monocrystalline semiconductor or compound semiconductor material layer.

Figure 3:
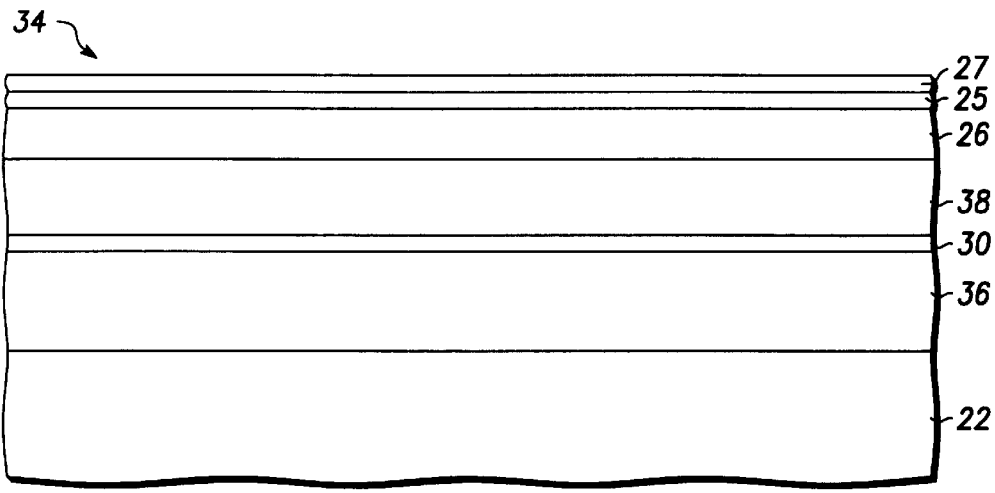

FIG. 3 schematically illustrates, in cross-section, a portion of yet another semiconductor structure 34 usable for optical switches. Structure 34 is similar to structure 20, except that structure 34 includes an amorphous layer 36, rather than accommodating buffer layer 24 and amorphous interface layer 28, and an additional monocrystalline layer 38.

As explained in greater detail below, amorphous layer 36 may be formed by first forming an accommodating buffer layer and an amorphous interface layer in a similar manner to that described above. Monocrystalline layer 38 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and additional monocrystalline layer 26 (subsequent to layer 38 formation) relieves stresses between layers 22 and 38 and provides a true compliant substrate for subsequent processing—e.g., monocrystalline material layer 26 formation.

The processes previously described above in connection with FIGS. 1 and 2 are adequate for growing monocrystalline material layers over a monocrystalline substrate. However, the process described in connection with FIG. 3, which includes transforming a monocrystalline accommodating buffer layer to an amorphous oxide layer, may be better for growing monocrystalline material layers because it allows any strain in layer 26 to relax.

Additional monocrystalline layer 38 may include any of the materials described throughout this application in connection with either of monocrystalline material layer 26 or additional buffer layer 32. For example, when monocrystalline material layer 26 comprises a semiconductor or compound semiconductor material, layer 38 may include monocrystalline Group IV or monocrystalline compound semiconductor materials.

Additional monocrystalline layer 38 can serve as an anneal cap during layer 36 formation and as a template for subsequent monocrystalline layer 26 formation. Accordingly, layer 38 is preferably thick enough to provide a suitable template for layer 26 growth (at least one monolayer) and thin enough to allow layer 38 to form as a substantially defect free monocrystalline material.

Additional monocrystalline layer 38 can comprise monocrystalline material (e.g., a material discussed above in connection with monocrystalline layer 26) that is thick enough to form devices within layer 38. In this case, the semiconductor structure does not include monocrystalline material layer 26. In other words, the semiconductor structure only includes one monocrystalline layer disposed above amorphous oxide layer 36.

The following non-limiting examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with this example, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. Accommodating buffer layer 24 can be a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 5 nm. In general, it is desired to have an accommodating buffer layer thick enough to isolate the monocrystalline material layer 26; from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1 to 2 nm.

In accordance with this example, monocrystalline material layer 26 is a compound semiconductor layer of gallium arsenide (GaAs) or gallium aluminum arsenide (GaAlAs) having a thickness of about 1 nm to about 100 micrometers ($\mu$m) and preferably a thickness of about 0.5 $\mu$m to 10 $\mu$m. The thickness generally depends on the application for which the layer is being prepared.

For an embodiment using piezoelectric semiconductor materials, the monocrystalline material layer 26 may be a compound semiconductor layer of gallium arsenide (GaAs) or aluminum gallium arsenide (GaAlAs) having a thickness of about 10 μm to about 100 μm, and a preferable thickness between 75 μm and 125 μm.

To facilitate the epitaxial growth of the gallium arsenide or gallium aluminum arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been illustrated to successfully grow GaAs layers.

EXAMPLE 2

In accordance with this example, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45-degree rotation with respect to the substrate silicon lattice structure.

An accommodating buffer layer formed of these zirconate or hafnate materials is suitable for the growth of a monocrystalline material layer that comprises compound semiconductor materials in the indium phosphide (InP) system. In this system, the compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 μm. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indium-strontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45-degree rotation with respect to the accommodating buffer layer lattice structure and a lattice mismatch to (100) InP of less than 2.5%, and preferably less than about 1.0%.

EXAMPLE 3

In accordance with this example, a structure is provided that is suitable for the growth of an epitaxial film of a monocrystalline material comprising a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. Where the monocrystalline layer comprises a compound semiconductor material, the II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

In this example of structure 40 illustrated in FIG. 2, substrate 22, accommodating buffer layer 24, and monocrystalline material layer 26 can be similar to those described in example 1. In addition, an additional buffer layer 32 serves to alleviate any strains that might result from a mismatch of the crystal lattice of the accommodating buffer layer and the lattice of the monocrystalline material. Buffer layer 32 can be a layer of germanium or a gallium arsenide GaAs, an gallium aluminum arsenide (GaAlAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this example, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying monocrystalline material which in this example is a compound semiconductor material. The compositions of other compound semiconductor materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline material layer which in this example is a compound semiconductor material. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline material layer 26 and template layer 30 can be the same as those described above in example 2. In addition, additional buffer layer 32 is inserted between the accommodating buffer layer and the overlying monocrystalline material layer. The buffer layer, a further monocrystalline material which in this instance comprises a semiconductor material, can be, for example, a graded layer of indium gallium arsenide (InGaAs) or indium aluminum arsenide (InAlAs). In accordance with one aspect of this embodiment, additional buffer layer 32 includes InGaAs, in which the indium composition varies from 0 to about 50%. The additional buffer layer 32; preferably has a thickness of about 10–30 nm. Varying the composition of the buffer layer from GaAs to InGaAs serves to provide a lattice match between the underlying monocrystalline oxide material and the overlying layer of monocrystalline material that in this example is a compound semiconductor material. Such a buffer layer is especially advantageous if there is a lattice mismatch between accommodating buffer layer 24 and monocrystalline material layer 26.

EXAMPLE 6

This example provides exemplary materials useful in structure 34, as illustrated in FIG. 3. Substrate material 22, template layer 30, and monocrystalline material layer 26 may be the same as those described above in connection with example 1.

Amorphous layer 36 is an amorphous oxide layer that is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of monocrystalline material comprising layer 26, and the like. In accordance with one exemplary aspect of example 6, layer 36 thickness is about 2 nm to about 100 nm, preferably about 2–10 nm, and more preferably about 5–6 nm.

Layer 38 comprises a monocrystalline material that can be grown epitaxially over a monocrystalline oxide material such as material used to form accommodating buffer layer 24. Layer 38 can include the same materials as those comprising layer 26. For example, if layer 26 includes GaAs, layer 38 also includes GaAs. However, alternatively, layer 38 may include materials different from those used to form layer 26. In accordance with one example, layer 38 is about 1 monolayer to about 100 nm thick.

Referring again to FIGS. 1–3, substrate 22 is a monocrystalline substrate such as monocrystalline silicon or gallium arsenide substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context, the terms "substantially equal" and "substantially matched" mean that there is sufficient similarity between the lattice constants to permit the growth of a high quality crystalline layer on the underlying layer.

Figure 4:
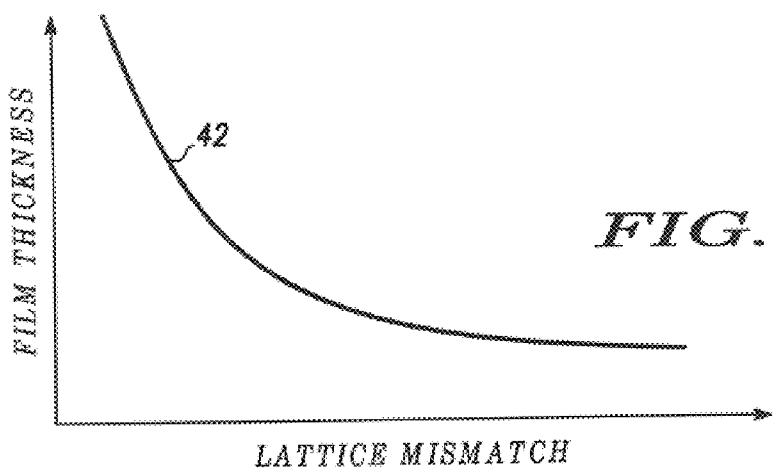
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that have a large number of defects. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

Substrate 22 can be a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. The lattice constant of layer 26 can differ from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. For example, if the grown crystal is gallium arsenide, gallium aluminum arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown monocrystalline material layer can be used to reduce strain in the grown monocrystalline material layer that might result from small differences in lattice constants. Better crystalline quality in the grown monocrystalline material layer can thereby be achieved.

The following example illustrates a process for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 4° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkaline earth metals or combinations of alkaline earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkaline earth metal oxide, such as strontium oxide, strontium barium oxide, or barium oxide, onto the substrate surface by MBE at a low temperature and by subsequently heating the structure to a temperature of about 750° C. At this temperature, a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stoichiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered (100) monocrystal with the (100) crystalline orientation rotated by 45° with respect to the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired monocrystalline material. For example, for the subsequent growth of a monocrystalline compound semiconductor material layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
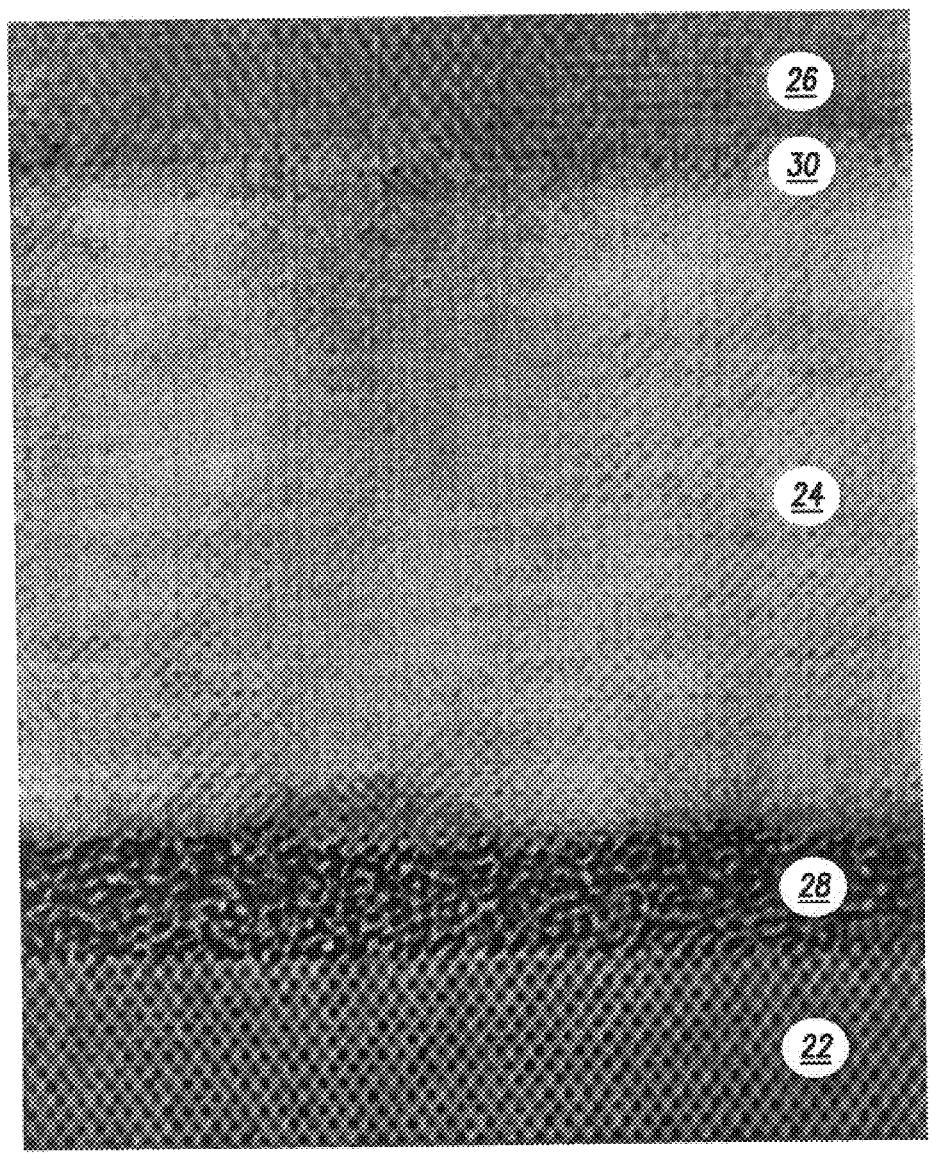
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with a process disclosed herein. Single crystal SrTiO$_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
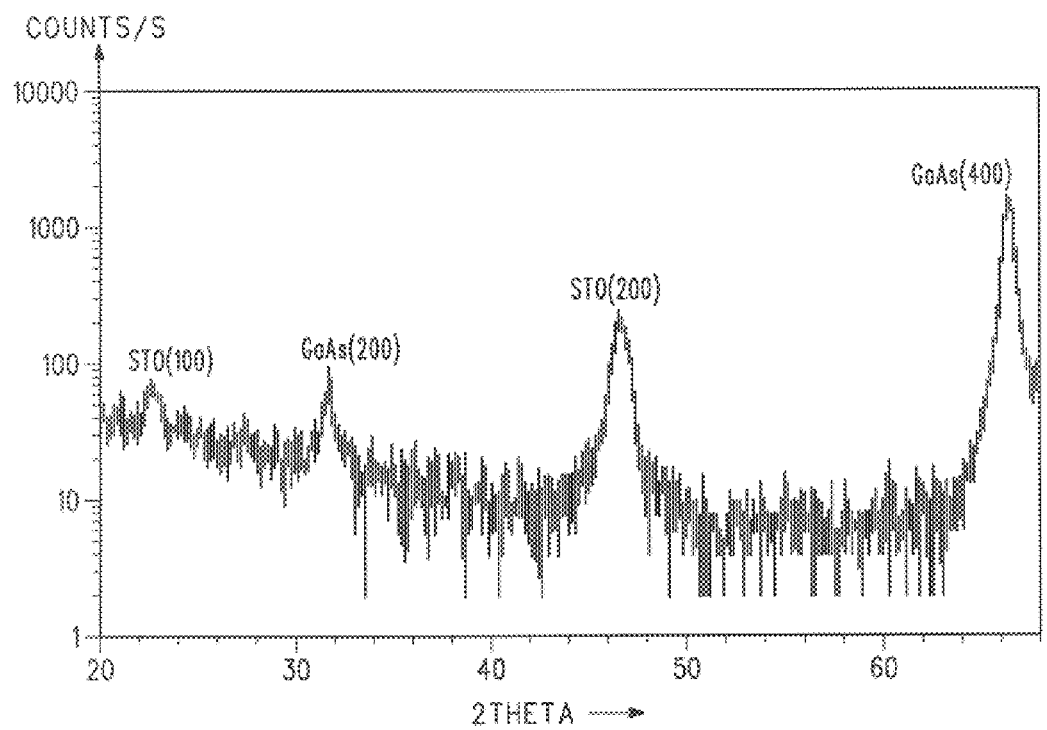
FIG. 6 illustrates an x-ray diffraction spectrum of a structure including a monocrystalline accommodating buffer layer.

FIG. 6 illustrates an x-ray diffraction spectrum taken on a structure including GaAs monocrystalline layer 26 comprising GaAs grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The additional buffer layer 32 is formed overlying the template layer before the deposition of the monocrystalline material layer. If the buffer layer is a monocrystalline material comprising a compound semiconductor superlattice, such a superlattice can be deposited, by MBE for example, on the template described above. If instead the buffer layer is a monocrystalline material layer comprising a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and monocrystalline layer 38 to a rapid thermal anneal process with a peak temperature of about 700° C. to about 1000° C. and a process time of about 5 seconds to about 10 minutes. However, other suitable anneal processes may be employed to convert the accommodating buffer layer to an amorphous layer in accordance with the present invention. For example, laser annealing, electron beam annealing, or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
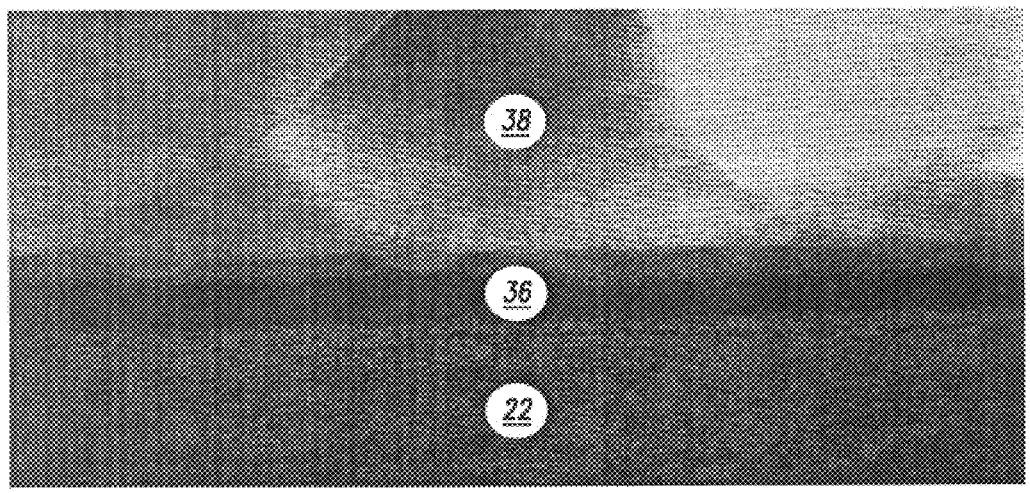
FIG. 7 illustrates a high resolution Transmission Electron Micrograph of a structure including an amorphous oxide layer.

FIG. 7 is a high resolution TEM of semiconductor material manufactured in accordance with the structure illustrated in FIG. 3. A single crystal SrTiO$_3$ accommodating buffer layer was grown epitaxially on silicon substrate 22. During this growth process, an amorphous interfacial layer forms as described above. Next, additional monocrystalline layer 38 comprising a compound semiconductor layer of GaAs is formed above the accommodating buffer layer and the accommodating buffer layer is exposed to an anneal process to form amorphous oxide layer 36.

Figure 8:
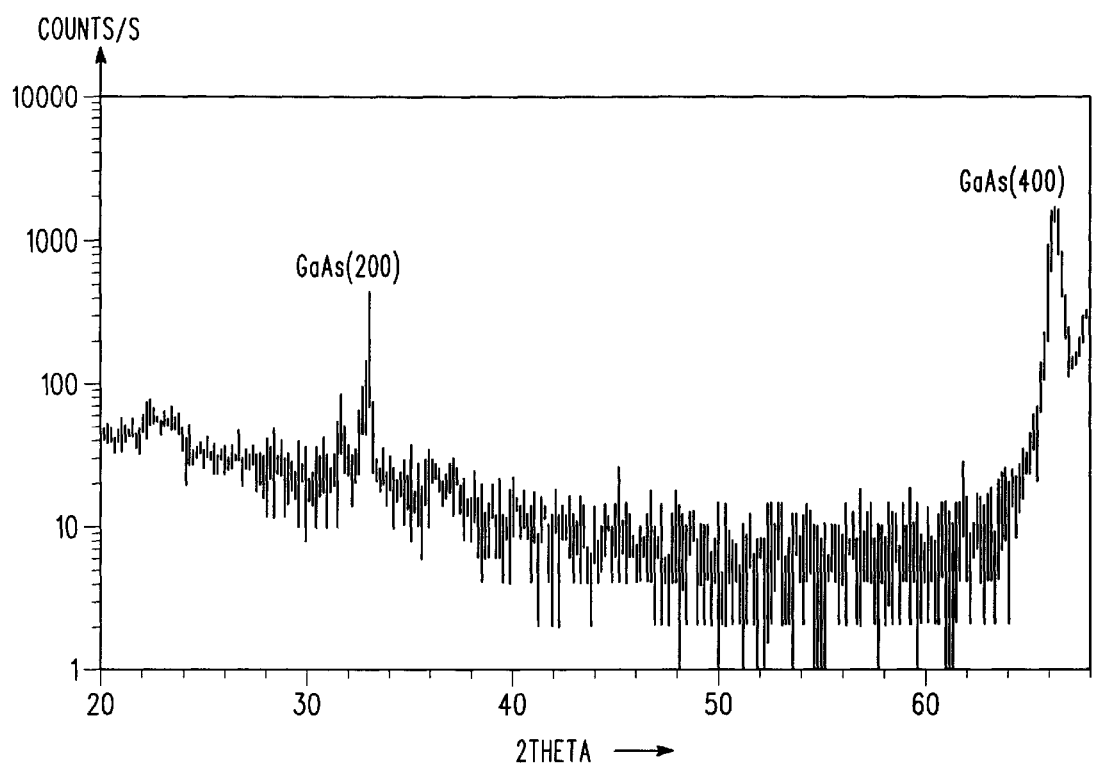
FIG. 8 illustrates an x-ray diffraction spectrum of a structure including an amorphous oxide layer.

FIG. 8 illustrates an x-ray diffraction spectrum taken on a structure including additional monocrystalline layer 38 comprising a GaAs compound semiconductor layer and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline material layer comprising a gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, alkaline earth metal tin-based perovskites, lanthanum aluminate, lanthanum scandium oxide, and gadolinium oxide can also be grown. Further, by a similar process such as MBE, other monocrystalline material layers comprising other III–V and II–VI monocrystalline compound semiconductors, semiconductors, metals and non-metals can be deposited overlying the monocrystalline oxide accommodating buffer layer.

Each of the variations of monocrystalline material layer and monocrystalline oxide accommodating buffer layer uses an appropriate template for initiating the growth of the monocrystalline material layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a monocrystalline material layer comprising compound semiconductors such as indium gallium arsenide, indium aluminum arsenide, or indium phosphide.

The formation of another device structure suitable for use with optical switches is illustrated schematically in cross-section in FIGS. 9–12. Like the previously described embodiments referred to in FIGS. 1–3, this structure involves the process of forming a compliant substrate utilizing the epitaxial growth of single crystal oxides, such as the formation of accommodating buffer layer 24 previously described with reference to FIGS. 1 and 2 and amorphous layer 36 previously described with reference to FIG. 3, and the formation of a template layer 30. However, the embodiment illustrated in FIGS. 9–12 utilizes a template that includes a surfactant to facilitate layer-by-layer monocrystalline material growth.

Figure 9:
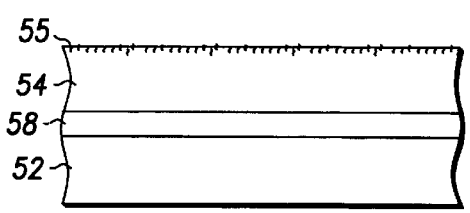
FIGS. 9–12 illustrate schematically, in cross-section, the formation of a device structure usable with optical switches in accordance with various embodiments of the invention.

Turning now to FIG. 9, an amorphous intermediate layer 58 is grown on substrate 52 at the interface between substrate 52 and a growing accommodating buffer layer 54, which is preferably a monocrystalline crystal oxide layer, by the oxidation of substrate 52 during the growth of layer 54. Layer 54 is preferably a monocrystalline oxide material such as a monocrystalline layer of Sr$_z$Ba$_{1-z}$TiO$_3$ where z ranges from 0 to 1. However, layer 54 may also comprise any of those compounds previously described with reference layer 24 in FIGS. 1–2 and any of those compounds previously described with reference to layer 36 in FIG. 3, which is formed from layers 24 and 28 referenced in FIGS. 1 and 2.

Figure 10:
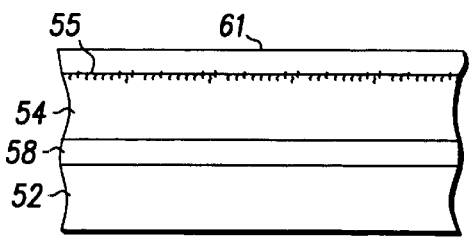
Figure 11:
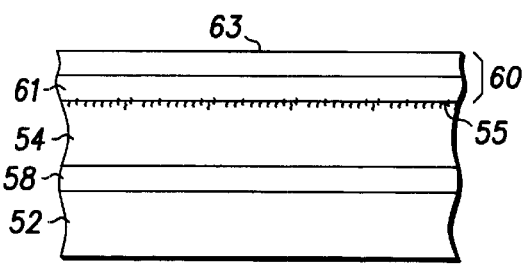

Layer 54 is grown with a strontium (Sr) terminated surface represented in FIG. 9 by hatched line 55 which is followed by the addition of a template layer 60 which includes a surfactant layer 61 and capping layer 63 as illustrated in FIGS. 10 and 11. Surfactant layer 61 may comprise, but is not limited to, elements such as Al, In and Ga, but will be dependent upon the composition of layer 54 and the overlying layer of monocrystalline material for optimal results. In one exemplary embodiment, aluminum (Al) is used for surfactant layer 61 and functions to modify the surface and surface energy of layer 54. Preferably, surfactant layer 61 is epitaxially grown, to a thickness of one to two monolayers, over layer 54 as illustrated in FIG. 10 by way of molecular beam epitaxy (MBE), although other epitaxial processes may also be performed including chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like.

Surfactant layer 61 is then exposed to a Group V element such as arsenic, for example, to form capping layer 63 as illustrated in FIG. 11. Surfactant layer 61 may be exposed to a number of materials to create capping layer 63 such as elements which include, but are not limited to, As, P, Sb and N. Surfactant layer 61 and capping layer 63 combine to form template layer 60.

Figure 12:
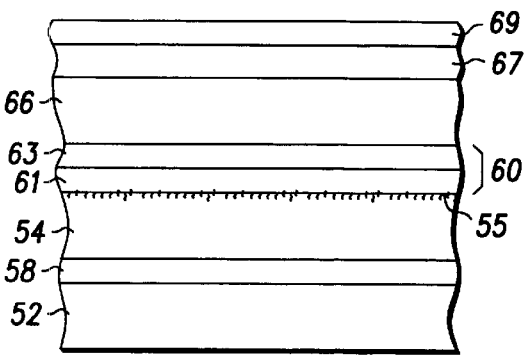
Figure 16:
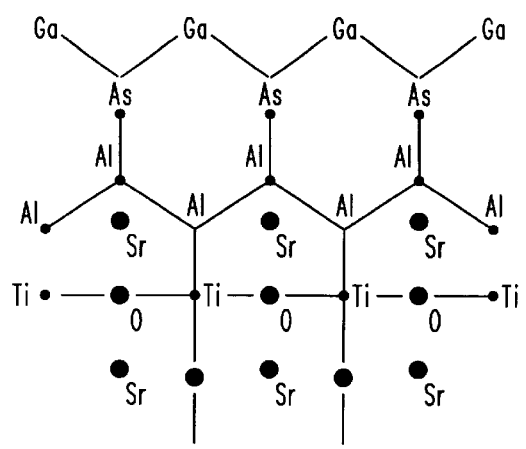

Monocrystalline material layer 66, which in this example is a compound semiconductor such as GaAs, is then deposited via MBE, CVD, MOCVD, MEE, ALE, PVD, CSD, PLD, and the like to form the final structure illustrated in FIG. 12. Gallium aluminum arsenide (GaAlAs) has better piezoelectric performance then gallium arsenide (GaAs), and is for one embodiment of the invention, more appropriate for use as a piezoelectric layer. However, monocrystalline material layer 66 may also comprise other piezoelectric or non-piezoelectric semiconductor materials, metals, or non-metal materials, which are used in the formation of semiconductor structures, devices and/or integrated circuits.

A piezoelectric layer 67 is then formed over the monocrystalline material layer 66 via MBE, CVD, MOCVD, MEE, ALE, PVD, CSD, PLD, and the like. The piezoelectric layer 67 can be a piezoelectric semiconductor, such as those described in connection with FIGS. 1–3, or a piezoelectric ceramic material. In an alternative embodiment, the piezoelectric layer 67 is omitted, and the piezoelectric properties of the monocrystalline material layer 66 are instead relied upon for optical switching, as discussed above in connection with FIG. 1.

A reflective layer 69 is formed over the piezoelectric layer 67 using materials and fabrication processes similar to those discussed above in connection with FIG. 1.

FIGS. 13–16 illustrate possible molecular bond structures for a specific example of a compound semiconductor structure as illustrated in FIGS. 9–12. More specifically, FIGS. 13–16 illustrate the growth of GaAs (layer 66) on the strontium terminated surface of a strontium titanate monocrystalline oxide (layer 54) using a surfactant containing template (layer 60).

The growth of a monocrystalline material layer 66 such as GaAs on an accommodating buffer layer 54 such as a strontium titanium oxide over amorphous interface layer 58 and substrate layer 52, both of which may comprise materials previously described with reference to layers 28 and 22, respectively in FIGS. 1 and 2, illustrates a critical thickness of about 1000 Angstroms where the two-dimensional (2D) and three-dimensional (3D) growth shifts because of the surface energies involved. In order to maintain a true layer-by-layer growth (Frank Van der Mere growth), the following relationship must be satisfied:

$$\delta_{STO} > (\delta_{INT} + \delta_{GaAs})$$

where the surface energy of the monocrystalline oxide layer 54 must be greater than the surface energy of the amorphous interface layer 58 added to the surface energy of the GaAs layer 66. Since it is impracticable to satisfy this equation, a surfactant containing template was used, as described above with reference to FIGS. 10–12, to increase the surface energy of the monocrystalline oxide layer 54 and also to shift the crystalline structure of the template to a diamond-like structure that is in compliance with the original GaAs layer.

Figure 13:
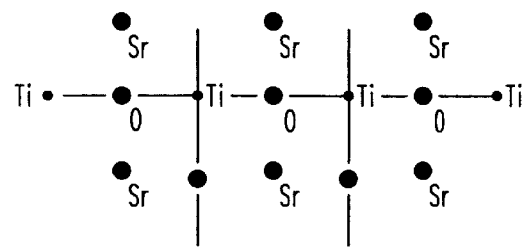
FIGS. 13–16 illustrate a probable molecular bonding structure of the device structures illustrated in FIGS. 9–12.
Figure 14:
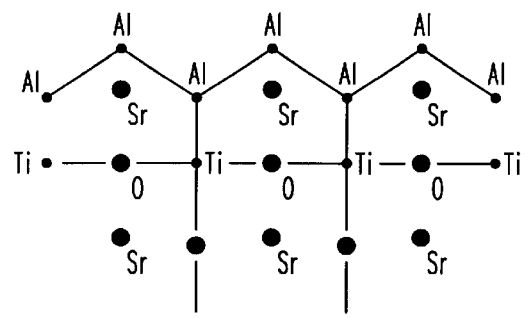
Figure 15:
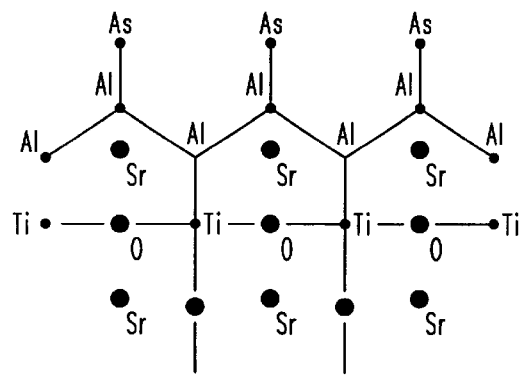

FIG. 13 illustrates the molecular bond structure of a strontium terminated surface of a strontium titanate monocrystalline oxide layer. An aluminum surfactant layer is deposited on top of the strontium terminated surface and bonds with that surface as illustrated in FIG. 14, which reacts to form a capping layer comprising a monolayer of $Al_2Sr$ having the molecular bond structure illustrated in FIG. 14 which forms a diamond-like structure with an $sp^3$ hybrid terminated surface that is compliant with compound semiconductors such as GaAs. The structure is then exposed to As to form a layer of AlAs as shown in FIG. 15. GaAs is then deposited to complete the molecular bond structure illustrated in FIG. 16, which has been obtained by 2D growth. The GaAs can be grown to any thickness for forming other semiconductor structures, devices, or integrated circuits. Alkaline earth metals such as those in Group IIA are those elements preferably used to form the capping surface of the monocrystalline oxide layer 54 because they are capable of forming a desired molecular structure with aluminum.

In this embodiment, a surfactant containing template layer aids in the formation of a compliant substrate for the monolithic integration of various material layers including those comprised of Group III–V compounds to form high quality semiconductor structures, devices and integrated circuits. For example, a surfactant containing template may be used for the monolithic integration of a monocrystalline material layer such as a layer comprising Germanium (Ge), for example, to form high efficiency photocells.

Turning now to FIGS. 17–20, the formation of another device structure usable for optical switches is illustrated in cross-section. This structure utilizes the formation of a compliant substrate that relies on the epitaxial growth of single crystal oxides on silicon followed by the epitaxial growth of single crystal silicon onto the oxide.

Figure 17:
FIGS. 17–20 illustrate schematically, in cross-section, the formation of a device structure usable with optical switches in accordance with various embodiments of the invention.

An accommodating buffer layer 74 such as a monocrystalline oxide layer is first grown on a substrate layer 72, such as silicon, with an amorphous interface layer 78 as illustrated in FIG. 17. Monocrystalline oxide layer 74 may be comprised of any of those materials previously discussed with reference to layer 24 in FIGS. 1 and 2, while amorphous interface layer 78 is preferably comprised of any of those materials previously described with reference to the layer 28 illustrated in FIGS. 1 and 2. Substrate 72, although preferably silicon, may also comprise any of those materials previously described with reference to substrate 22 in FIGS. 1–3.

Figure 18:
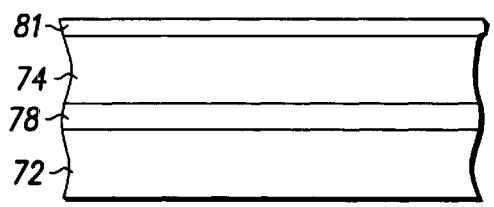

Next, a silicon layer 81 is deposited over monocrystalline oxide layer 74 via MBE, CVD, MOCVD, MEE, ALE, PVD, CSD, PLD, and the like as illustrated in FIG. 18 with a thickness of a few hundred Angstroms but preferably with a thickness of about 50 Angstroms. Monocrystalline oxide layer 74 preferably has a thickness of about 20 to 100 Angstroms.

Figure 19:
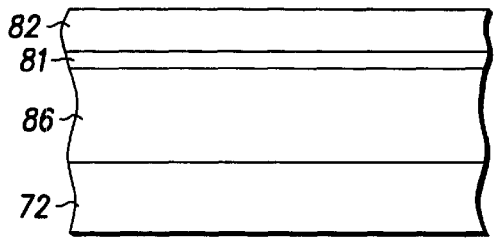
Figure 20:
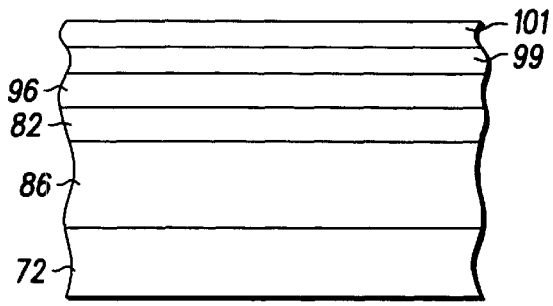

Rapid thermal annealing is then conducted in the presence of a carbon source such as acetylene or methane, for example at a temperature within a range of about 800° C. to 1000° C. to form capping layer 82 and silicate amorphous layer 86. However, other suitable carbon sources may be used as long as the rapid thermal annealing step functions to amorphize the monocrystalline oxide layer 74 into a silicate amorphous layer 86 and carbonize the top silicon layer 81 to form capping layer 82 which in this example would be a silicon carbide (SiC) layer as illustrated in FIG. 19. The formation of amorphous layer 86 is similar to the formation of layer 36 illustrated in FIG. 3 and may comprise any of those materials described with reference to layer 36 in FIG. 3 but the preferable material will be dependent upon the capping layer 82 used for silicon layer 81.

A compound semiconductor layer 96, such as gallium nitride (GaN) is grown over the SiC surface by way of MBE, CVD, MOCVD, MEE, ALE, PVD, CSD, PLD, or the like to form a high quality compound semiconductor material for device formation. More specifically, the deposition of GaN and GaN based systems such as GaInN and AlGaN will result in the formation of dislocation nets confined at the silicon/amorphous region. For one embodiment of the invention, more appropriate nitride compounds may be used as a piezoelectric layer. The resulting nitride containing compound semiconductor material may comprise elements from groups III, IV and V of the periodic table and is defect free.

A piezoelectric layer 99 is then formed over the compound semiconductor layer 96 via MBE, CVD, MOCVD, MEE, ALE, PVD, CSD, PLD, and the like. The piezoelectric layer 99 can be a piezoelectric semiconductor, such as those described in connection with FIGS. 1–3, or piezoelectric ceramic material. In an alternative embodiment, the piezoelectric layer 99 is omitted, and the piezoelectric properties of the compound semiconductor layer 96 are instead relied upon for optical switching, as previously discussed in connection with FIG. 1.

A reflective layer 101 is formed over the piezoelectric layer 99 using materials and fabrication processes similar to those previously discussed in connection with FIG. 1.

Although GaN has been grown on SiC substrate in the past, this structure possesses a one step formation of the compliant substrate containing a SiC top surface and an amorphous layer on a Si surface. More specifically, this structure uses an intermediate single crystal oxide layer that is amorphosized to form a silicate layer that adsorbs the strain between the layers. Moreover, unlike past use of a SiC substrate, this structure is not limited by wafer size, which is usually less than 50 mm in diameter for prior art SiC substrates.

The monolithic integration of nitride containing semiconductor compounds containing group III–V nitrides and silicon devices can be used for high temperature RF applications and optoelectronics. GaN systems have particular use in the photonic industry for the blue/green and UV light sources and detection. High brightness light emitting diodes (LEDs) and lasers may also be formed within the GaN system.

Figure 21:
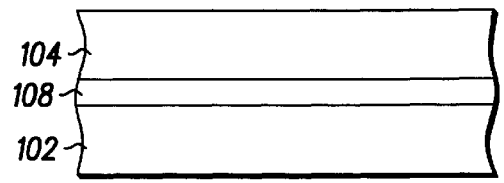
FIGS. 21–23 illustrate schematically, in cross-section, the formation of another device structure usable with optical switches in accordance with various embodiments of the invention.
Figure 22:
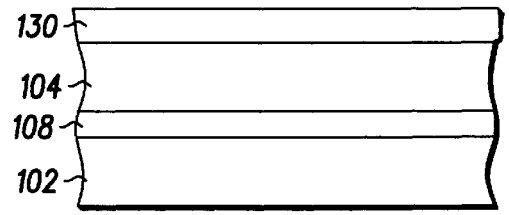
Figure 23:
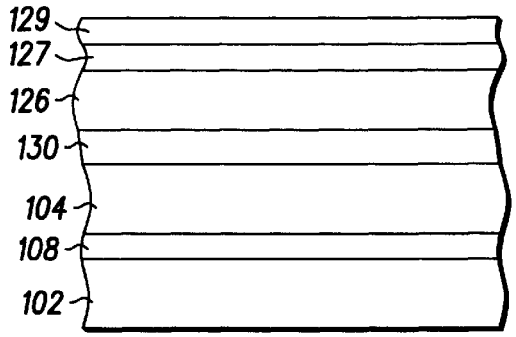

FIGS. 21–23 schematically illustrate, in cross-section, the formation of yet another device structure suitable for used with optical switches. This structure includes a compliant layer that functions as a transition layer that uses clathrate or Zintl type bonding. More specifically, this structure utilizes an intermetallic template layer to reduce the surface energy of the interface between material layers thereby allowing for two-dimensional layer-by-layer growth.

The structure illustrated in FIG. 21 includes a monocrystalline substrate 102, an amorphous interface layer 108 and an accommodating buffer layer 104. Amorphous interface layer 108 is formed on substrate 102 at the interface between substrate 102 and accommodating buffer layer 104 as previously described with reference to FIGS. 1 and 2. Amorphous interface layer 108 may comprise any of those materials previously described with reference to amorphous interface layer 28 in FIGS. 1 and 2. Substrate 102 is preferably silicon but may also comprise any of those materials previously described with reference to substrate 22 in FIGS. 1–3.

A template layer 130 is deposited over accommodating buffer layer 104 as illustrated in FIG. 22 and preferably comprises a thin layer of Zintl type phase material composed of metals and metalloids having a great deal of ionic character. As in previously described embodiments, template layer 130 is deposited by way of MBE, CVD, MOCVD, MEE, ALE, PVD, CSD, PLD, or the like to achieve a thickness of one monolayer. Template layer 130 functions as a "soft" layer with non-directional bonding but high crystallinity, which absorbs stress build up between layers having lattice mismatch. Materials for template 130 may include, but are not limited to, materials containing Si, Ga, In, and Sb such as, for example, $AlSr_2$, $(MgCaYb)Ga_2$, $(Ca,Sr,Eu,Yb)In_2$, $BaGe_2As$, and $SrSn_2As_2$ A monocrystalline material layer 126 is epitaxially grown over template layer 130 to achieve the structure illustrated in FIG. 23. As a specific example, an $SrAl_2$ layer may be used as template layer 130 and an appropriate monocrystalline material layer 126 such as a compound semiconductor material GaAs is grown over the $SrAl_2$. The Al—Ti (from the accommodating buffer layer of layer of $Sr_zBa_{1-z}TiO_3$ where z ranges from 0 to 1) bond is mostly metallic while the Al—As (from the GaAs layer) bond is weakly covalent. The Sr participates in two distinct types of bonding with part of its electric charge going to the oxygen atoms in the lower accommodating buffer layer 104 comprising $Sr_zBa_{1-z}TiO_3$ to participate in ionic bonding and the other part of its valence charge being donated to Al in a way that is typically carried out with Zintl phase materials. The amount of the charge transfer depends on the relative electronegativity of elements comprising the template layer 130 as well as on the interatomic distance. In this example, Al assumes an $sp^3$ hybridization and can readily form bonds with monocrystalline material layer 126, which in this example comprises compound semiconductor material GaAs.

A monocrystalline semiconductor or compound semiconductor wafer fabricated using the methods described with reference to FIGS. 1–22 can be used in forming monocrystalline material layers over the wafer. In this manner, the wafer is essentially a "handle" wafer used during the fabrication of semiconductor electrical components within a monocrystalline layer overlying the wafer. Therefore, electrical components can be formed within semiconductor materials over a wafer of at least approximately 200 millimeters in diameter and possibly at least approximately 300 millimeters.

By the use of this type of substrate, a relatively inexpensive "handle" wafer overcomes the fragile nature of compound semiconductor or other monocrystalline material wafers by placing them over a relatively more durable and easy to fabricate base material. Therefore, an integrated circuit can be formed such that all electrical components, and particularly all active electronic devices, can be formed within or using the monocrystalline material layer even though the substrate itself may include a monocrystalline semiconductor material. Further, if the monocrystalline semiconductor material has piezoelectric properties, one embodiment of the invention may use the wafer as a piezoelectric wafer alone. Referring to FIG. 23, a piezoelectric layer 127 is then formed over the monocrystalline material layer 126 via MBE, CVD, MOCVD, MEE, ALE, PVD, CSD, PLD, or the like. The piezoelectric layer 127 can be a piezoelectric semiconductor, such as those previously described in connection with FIGS. 1–3, or piezoelectric ceramic material. In an alternative embodiment, the piezoelectric layer 127 is omitted, and the piezoelectric properties of the monocrystalline material layer 126 are instead relied upon for optical switching, as discussed above in connection with FIG. 1.

A reflective layer 129 is formed over the piezoelectric layer 127 using materials and fabrication processes similar to those previously discussed in connection with FIG. 1.

The compliant substrate produced by use of the Zintl type template layer used in this embodiment can absorb a large strain without a significant energy cost. In the above example, the bond strength of the Al is adjusted by changing the volume of the $SrAl_2$ layer thereby making the device tunable for specific applications, which include the monolithic integration of III–V and Si devices and the monolithic integration of high-k dielectric materials for CMOS technology.

Figure 24:
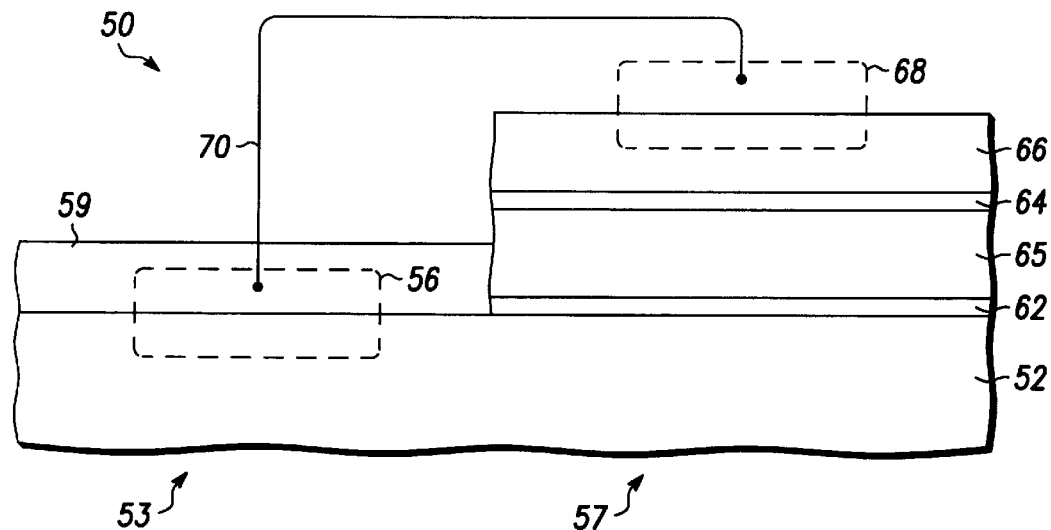
FIGS. 24–25 illustrate schematically, in cross section, device structures that can be used in accordance with various embodiments of the invention.

FIG. 24 illustrates schematically, in cross section, a device structure 50 usable for forming electrical components for controlling and driving optical switches. Device structure 50 includes a monocrystalline semiconductor substrate 52, preferably a monocrystalline silicon wafer. Monocrystalline semiconductor substrate 52 includes two regions, 53 and 57. An electrical semiconductor component generally indicated by the dashed line 56 is formed, at least partially, in region 53. Electrical component 56 can be a resistor, a capacitor, an active semiconductor component such as a diode or a transistor or an integrated circuit such as a CMOS integrated circuit. For example, electrical semiconductor component 56 can be a CMOS integrated circuit configured to perform digital signal processing or another function for which silicon integrated circuits are well suited. The electrical semiconductor component in region 53 can be formed by conventional semiconductor processing as well known and widely practiced in the semiconductor industry. A layer of insulating material 59 such as a layer of silicon dioxide or the like may overlie electrical semiconductor component 56.

Insulating material 59 and any other layers that may have been formed or deposited during the processing of semiconductor component 56 in region 53 are removed from the surface of region 57 to provide a bare silicon surface in that region. As is well known, bare silicon surfaces are highly reactive and a native silicon oxide layer can quickly form on the bare surface. A layer of barium or barium and oxygen is deposited onto the native oxide layer on the surface of region 57 and is reacted with the oxidized surface to form a first template layer (not shown). In accordance with one embodiment, a monocrystalline oxide layer is formed overlying the template layer by a process of molecular beam epitaxy. Reactants including barium, titanium and oxygen are deposited onto the template layer to form the monocrystalline oxide layer. Initially during the deposition the partial pressure of oxygen is kept near the minimum necessary to fully react with the barium and titanium to form monocrystalline barium titanate layer. The partial pressure of oxygen is then increased to provide an overpressure of oxygen and to allow oxygen to diffuse through the growing monocrystalline oxide layer. The oxygen diffusing through the barium titanate reacts with silicon at the surface of region 57 to form an amorphous layer of silicon oxide 62 on second region 57 and at the interface between silicon substrate 52 and the monocrystalline oxide layer 65. Layers 65 and 62 may be subject to an annealing process as described above in connection with FIG. 3 to form a single amorphous accommodating layer.

In accordance with an embodiment, the step of depositing the monocrystalline oxide layer 65 is terminated by depositing a second template layer 64, which can be 1–10 monolayers of titanium, barium, barium and oxygen, or titanium and oxygen. A layer 66 of a monocrystalline compound semiconductor material is then deposited overlying second template layer 64 by a process of molecular beam epitaxy. The deposition of layer 66 is initiated by depositing a layer of arsenic onto template 64. This initial step is followed by depositing gallium and arsenic to form monocrystalline gallium arsenide 66. Alternatively, strontium can be substituted for barium in the above example.

In accordance with a further embodiment, a semiconductor component, generally indicated by a dashed line 68 is formed in compound semiconductor layer 66. Semiconductor component 68 can be formed by processing steps conventionally used in the fabrication of gallium arsenide or other III–V compound semiconductor material devices. Semiconductor component 68 can be any active or passive component, and preferably is a semiconductor laser, light emitting diode, photodetector, heterojunction bipolar transistor (HBT), high frequency MESFET, or other component that utilizes and takes advantage of the physical properties of compound semiconductor materials. A metallic conductor schematically indicated by the line 70 can be formed to electrically couple device 68 and device 56, thus implementing an integrated device that includes at least one component formed in silicon substrate 52 and one device formed in monocrystalline compound semiconductor material layer 66. Although illustrative structure 50 has been described as a structure formed on a silicon substrate 52 and having a barium (or strontium) titanate layer 65 and a gallium arsenide layer 66, similar devices can be fabricated using other substrates, monocrystalline oxide layers and other compound semiconductor layers as described elsewhere in this disclosure.

Figure 25:
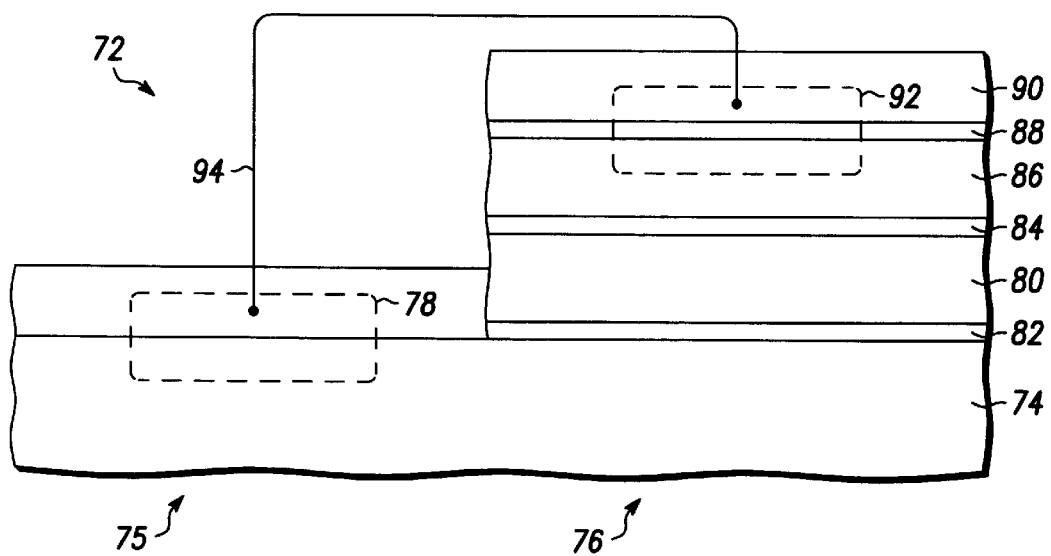

FIG. 25 illustrates a semiconductor structure 71 usable for forming electrical components associated with controlling and driving optical switches. Structure 71 includes a monocrystalline semiconductor substrate 73 such as a monocrystalline silicon wafer that includes a region 75 and a region 76. An electrical component schematically illustrated by the dashed line 79 is formed in region 75 using conventional silicon device processing techniques commonly used in the semiconductor industry. Using process steps similar to those described above, a monocrystalline oxide layer 80 and an intermediate amorphous silicon oxide layer 83 are formed overlying region 76 of substrate 73. A template layer 84 and subsequently a monocrystalline semiconductor layer 87 are formed overlying monocrystalline oxide layer 80. In accordance with a further embodiment, an additional monocrystalline oxide layer 88 is formed overlying layer 87 by process steps similar to those used to form layer 80, and an additional monocrystalline semiconductor layer 90 is formed overlying monocrystalline oxide layer 88 by process steps similar to those used to form layer 87. In accordance with one embodiment, at least one of layers 87 and 90 are formed from a compound semiconductor material. Layers 80 and 83 may be subject to an annealing process as described above in connection with FIG. 3 to form a single amorphous accommodating layer.

A semiconductor component generally indicated by a dashed line 92 is formed at least partially in monocrystalline semiconductor layer 87. In accordance with one embodiment, semiconductor component 92 may include a field effect transistor having a gate dielectric formed, in part, by monocrystalline oxide layer 88. In addition, monocrystalline semiconductor layer 90 can be used to implement the gate electrode of that field effect transistor. In accordance with one embodiment, monocrystalline semiconductor layer 87 is formed from a group III–V compound and semiconductor component 92 is a radio frequency amplifier that takes advantage of the high mobility characteristic of group III–V component materials. In accordance with yet a further embodiment, an electrical interconnection schematically illustrated by the line 94 electrically interconnects component 79 and component 92. Structure 71 thus integrates components that take advantage of the unique properties of the two monocrystalline semiconductor materials.

Attention is now directed to a method for forming exemplary portions of illustrative composite semiconductor structures or composite integrated circuits like 50 or 71. In particular, the illustrative composite semiconductor structure or integrated circuit 103 shown in FIGS. 26–30 includes a compound semiconductor portion 1022, a bipolar portion 1024, and a MOS portion 1026. In FIG. 26, a p-type doped, monocrystalline silicon substrate 110 is provided having a compound semiconductor portion 1022, a bipolar portion 1024, and an MOS portion 1026. Within bipolar portion 1024, the monocrystalline silicon substrate 110 is doped to form an N+ buried region 1102. A lightly p-type doped epitaxial monocrystalline silicon layer 1104 is then formed over the buried region 1102 and the substrate 110. A doping step is then performed to create a lightly n-type doped drift region 1117 above the N+ buried region 1102. The doping step converts the dopant type of the lightly p-type epitaxial layer within a section of the bipolar region 1024 to a lightly n-type monocrystalline silicon region. A field isolation region 1106 is then formed between and around the bipolar portion 1024 and the MOS portion 1026. A gate dielectric layer 1110 is formed over a portion of the epitaxial layer 1104 within MOS portion 1026, and the gate electrode 1112 is then formed over the gate dielectric layer 1110. Sidewall spacers 1115 are formed along vertical sides of the gate electrode 1112 and gate dielectric layer 1110.

A p-type dopant is introduced into the drift region 1117 to form an active or intrinsic base region 1114. An n-type, deep collector region 1108 is then formed within the bipolar portion 1024 to allow electrical connection to the buried region 1102. Selective n-type doping is performed to form N+ doped regions 1116 and the emitter region 1120. N+ doped regions 1116 are formed within layer 1104 along adjacent sides of the gate electrode 1112 and are source, drain, or source/drain regions for the MOS transistor. The N+ doped regions 1116 and emitter region 1120 have a doping concentration of at least 1E19 atoms per cubic centimeter to allow ohmic contacts to be formed. A p-type doped region is formed to create the inactive or extrinsic base region 1118 which is a $P^4+$ doped region (doping concentration of at least 1E19 atoms per cubic centimeter).

In the embodiment described, several processing steps have been performed but are not illustrated or further described, such as the formation of well regions, threshold adjusting implants, channel punchthrough prevention implants, field punchthrough prevention implants, as well as a variety of masking layers. The formation of the device up to this point in the process is performed using conventional steps. As illustrated, a standard N-channel MOS transistor has been formed within the MOS region 1026, and a vertical NPN bipolar transistor has been formed within the bipolar portion 1024. Although illustrated with a NPN bipolar transistor and a N-channel MOS transistor, device structures and circuits in accordance with various embodiments may additionally or alternatively include other electronic devices formed using the silicon substrate. As of this point, no circuitry has been formed within the compound semiconductor portion 1022.

After the silicon devices are formed in regions 1024 and 1026, a protective layer 1122 is formed overlying devices in regions 1024 and 1026 to protect devices in regions 1024 and 1026 from potential damage resulting from device formation in region 1022. Layer 1122 may be formed of, for example, an insulating material such as silicon oxide or silicon nitride.

All of the layers that have been formed during the processing of the bipolar and MOS portions of the integrated circuit, except for epitaxial layer 1104 but including protective layer 1122, are now removed from the surface of compound semiconductor portion 1022. A bare silicon surface is thus provided for the subsequent processing of this portion, for example in the manner set forth above.

An accommodating buffer layer 124 is then formed over the substrate 110 as illustrated in FIG. 27. The accommodating buffer layer will form as a monocrystalline layer over the properly prepared (i.e., having the appropriate template layer) bare silicon surface in portion 1022. The portion of layer 124 that forms over portions 1024 and 1026, however, may be polycrystalline or amorphous because it is formed over a material that is not monocrystalline, and therefore, does not nucleate monocrystalline growth. The accommodating buffer layer 124 typically is a monocrystalline metal oxide or nitride layer and typically has a thickness in a range of approximately 2–100 nanometers. In one particular embodiment, the accommodating buffer layer is approximately 5–15 nm thick. During the formation of the accommodating buffer layer, an amorphous intermediate layer 122 is formed along the uppermost silicon surfaces of the integrated circuit 103. This amorphous intermediate layer 122 typically includes an oxide of silicon and has a thickness and range of approximately 1–5 nm. In one particular embodiment, the thickness is approximately 2 nm. Following the formation of the accommodating buffer layer 124 and the amorphous intermediate layer 122, a template layer 125 is then formed and has a thickness in a range of approximately one to ten monolayers of a material. In one particular embodiment, the material includes titanium-arsenic, strontium-oxygen-arsenic, or other similar materials as previously described with respect to FIGS. 1–5. A monocrystalline compound semiconductor layer 132 is then epitaxially grown overlying the monocrystalline portion of accommodating buffer layer 124 as shown in FIG. 28. The portion of layer 132 that is grown over portions of layer 124 that are not monocrystalline may be polycrystalline or amorphous. The compound semiconductor layer can be formed by a number of methods and typically includes a material such as gallium arsenide, aluminum gallium arsenide, indium phosphide, or other compound semiconductor materials as previously mentioned. The thickness of the layer is in a range of approximately 1–5,000 nm, and more preferably 100–2000 nm. Furthermore, additional monocrystalline layers may be formed above layer 132, as discussed in more detail below in connection with FIGS. 31–32.

In this particular embodiment, each of the elements within the template layer are also present in the accommodating buffer layer 124, the monocrystalline compound semiconductor material 132, or both. Therefore, the delineation between the template layer 125 and its two immediately adjacent layers disappears during processing. Therefore, when a transmission electron microscopy (TEM) photograph is taken, an interface between the accommodating buffer layer 124 and the monocrystalline compound semiconductor layer 132 is seen.

After at least a portion of layer 132 is formed in region 1022, layers 122 and 124 may be subject to an annealing process as described above in connection with FIG. 3 to form a single amorphous accommodating layer. If only a portion of layer 132 is formed prior to the anneal process, the remaining portion may be deposited onto structure 103 prior to further processing.

Figure 29:
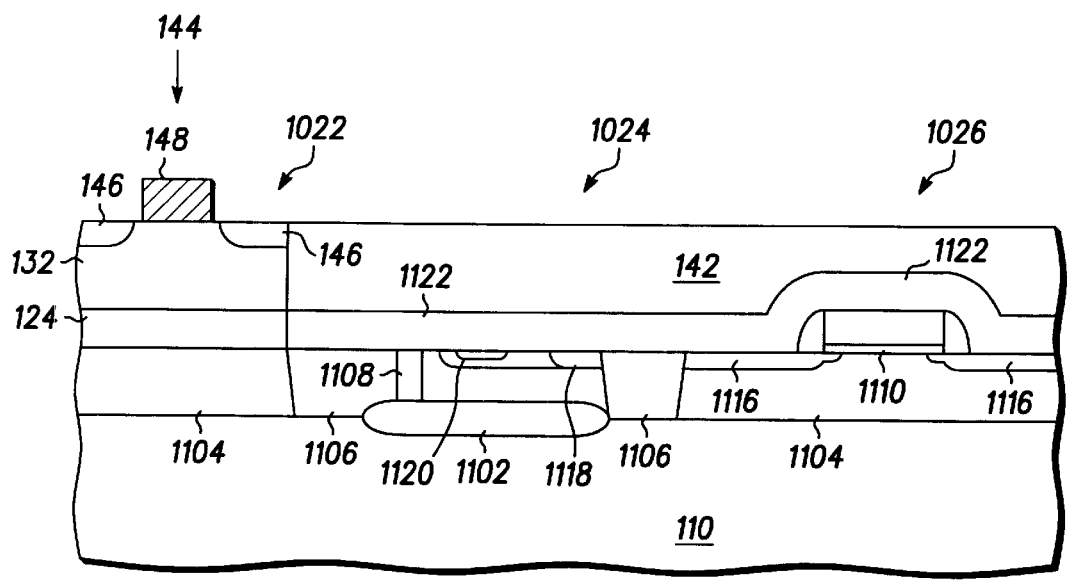

At this point in time, sections of the compound semiconductor layer 132 and the accommodating buffer layer 124 (or of the amorphous accommodating layer if the annealing process described above has been carried out) are removed from portions overlying the bipolar portion 1024 and the MOS portion 1026 as shown in FIG. 29. After the section of the compound semiconductor layer and the accommodating buffer layer 124 are removed, an insulating layer 142 is formed over protective layer 1122. The insulating layer 142 can include a number of materials such as oxides, nitrides, oxynitrides, low-k dielectrics, or the like. As used herein, low-k is a material having a dielectric constant no higher than approximately 3.5. After the insulating layer 142 has been deposited, it is then polished, removing portions of the insulating layer 142 that overlie monocrystalline compound semiconductor layer 132.

A transistor 144 is then formed within the monocrystalline compound semiconductor portion 1022. A gate electrode 148 is then formed on the monocrystalline compound semiconductor layer 132. Doped regions 146 are then formed within the monocrystalline compound semiconductor layer 132. In this embodiment, the transistor 144 is a metal-semiconductor field-effect transistor (MESFET). If the MESFET is an n-type MESFET, the doped regions 146 and at least a portion of monocrystalline compound semiconductor layer 132 are also n-type doped. If a p-type MESFET were to be formed, then the doped regions 146 and at least a portion of monocrystalline compound semiconductor layer 132 would have just the opposite doping type. The heavier doped ($N^+$) regions 146 allow ohmic contacts to be made to the monocrystalline compound semiconductor layer 132. At this point in time, the active devices within the integrated circuit have been formed. Although not illustrated in the drawing figures, additional processing steps such as formation of well regions, threshold adjusting implants, channel punchthrough prevention implants, field punchthrough prevention implants, and the like may be performed in accordance with the present invention. This particular embodiment includes an n-type MESFET, a vertical NPN bipolar transistor, and a planar n-channel MOS transistor. Many other types of transistors, including P-channel MOS transistors, p-type vertical bipolar transistors, p-type MESFETs, and combinations of vertical and planar transistors, can be used. Also, other electrical components, such as resistors, capacitors, diodes, and the like, may be formed in one or more of the portions 1022, 1024, and 1026.

Figure 30:
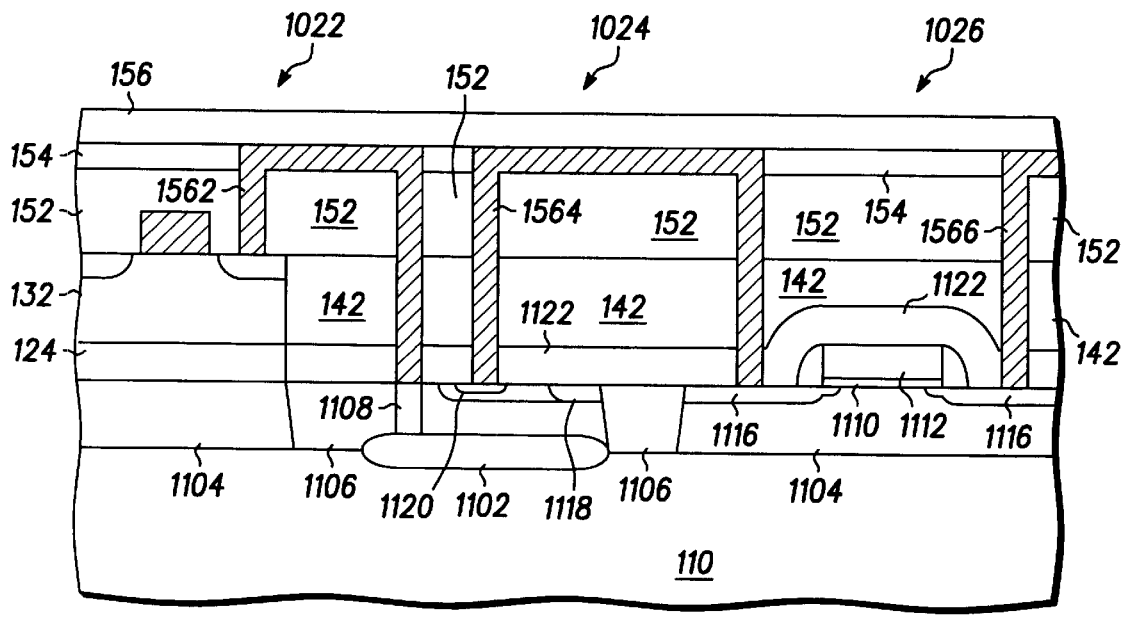

Processing continues to form a substantially completed integrated circuit 103 as illustrated in FIG. 30. An insulating layer 152 is formed over the substrate 110. The insulating layer 152 may include an etch-stop or polish-stop region that is not illustrated in FIG. 30. A second insulating layer 154 is then formed over the first insulating layer 152. Portions of layers 154, 152, 142, 124, and 1122 are removed to define contact openings where the devices are to be interconnected. Interconnect trenches are formed within insulating layer 154 to provide the lateral connections between the contacts. As illustrated in FIG. 30, interconnect 1562 connects a source or drain region of the n-type MESFET within portion 1022 to the deep collector region 1108 of the NPN transistor within the bipolar portion 1024. The emitter region 1120 of the NPN transistor is connected to one of the doped regions 1116 of the n-channel MOS transistor within the MOS portion 1026. The other doped region 1116 is electrically connected to other portions of the integrated circuit that are not shown. Similar electrical connections are also formed to couple regions 1118 and 1112 to other regions of the integrated circuit.

A passivation layer 156 is formed over the interconnects 1562, 1564, and 1566 and insulating layer 154. Other electrical connections are made to the transistors as illustrated as well as to other electrical or electronic components within the integrated circuit 103 but are not illustrated in the FIGS. Further, additional insulating layers and interconnects may be formed as necessary to form the proper interconnections between the various components within the integrated circuit 103.

As can be seen from the previous embodiment, active devices for both compound semiconductor and Group IV semiconductor materials can be integrated into a single integrated circuit. Because there is some difficulty in incorporating both bipolar transistors and MOS transistors within a same integrated circuit, it may be possible to move some of the components within bipolar portion 1024 into the compound semiconductor portion 1022 or the MOS portion 1026. Therefore, the requirement of special fabricating steps solely used for making a bipolar transistor can be eliminated. Therefore, there would only be a compound semiconductor portion and a MOS portion to the integrated circuit.

Figure 31:
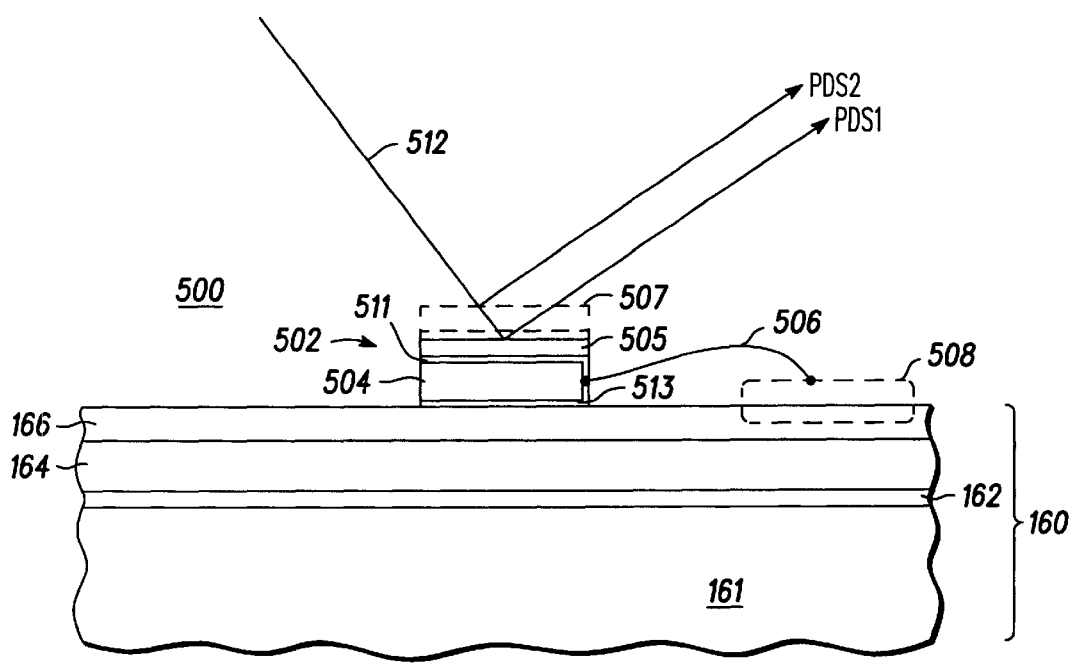
FIG. 31 illustrates schematically, in cross-section, an optical switch in accordance with an embodiment of the invention.

FIG. 31 illustrates schematically, in cross-section, an optical switch 500 in accordance with an embodiment of the invention. The switch 500 includes a semiconductor device structure 160 that includes a monocrystalline silicon wafer 161. An amorphous intermediate layer 162 and an accommodating buffer layer 164, similar to those previously described, have been formed over wafer 161. Layers 162 and 164 may be subject to an annealing process as described above in connection with FIG. 3 to form a single amorphous accommodating layer. A compound semiconductor material layer 166 is formed over the layer 164, as previously discussed herein.

An optical switching element 502 is formed on the compound semiconductor layer 166. The switching element 502 includes a piezoelectric layer 504 and a reflective layer 505, such as those previously discussed herein. Alternatively, the optical switching element 502 can be formed in or on the accommodating buffer layer 164. If the element 502 is formed in the accommodating buffer layer 164, the accommodating buffer layer 164 preferably consists of barium titanate (BTO). If the element 502 is formed on top of the accommodating buffer layer 164, the piezoelectric material of piezoelectric layer 504 can be a piezoelectric monocrystalline semiconductor or piezoelectric monocrystalline ceramic. PZT or PLZT are examples of piezoelectric monocrystalline ceramics, and can be formed by sol gel deposition techniques. The switching element 502 also includes electrode layers 511,513 for applying an electric field across the piezoelectric material 504. The electrodes 511,513 may be any suitable conducting material and may be formed using conductive monocrystalline oxides or using metallic conductors. Monocrystalline conductive oxides include strontium ruthenate, strontium vanadate, and (La,Sr)$CoO_3$. Sputter deposition techniques may be used to form the conductive monocrystalline oxides. RF Magnetron Sputtering, in particular, can be used to deposit the monocrystalline layer of (La,Sr)$CoO_3$.

A driver circuit 508 is electrically coupled to the electrodes 511,513 using suitable conductors 506, such as metallic conductors. The driver circuit 508 activates the piezoelectric layer 504 by selectively applying a voltage across the layer 504. The driver circuit 508 can include any suitable combination of electrical components, including those previously discussed in connection with FIGS. 24–30, for activating the light switching element 502.

In operation, the switching element 502 moves the reflective surface of layer 505 between various positions to alter the path of incident light 512 reflected by the surface. By altering the path of the reflected light, the switching element 502 can act as an optical switch in many applications, such as optical computing, fiber optic communications, and the like.

In the example shown, two positions 505, 507 are illustrated, although any number of positions can be achieved by varying the electric field applied to the piezoelectric layer 504 by the driver circuit 508. In the inactive position 505, no electric field is applied to the layer 504, as the reflected light takes a path designated by POS 1. In the active position 507, an electric field is applied to the layer 504 and the reflected light takes a path designated by POS 2.

Figure 32:
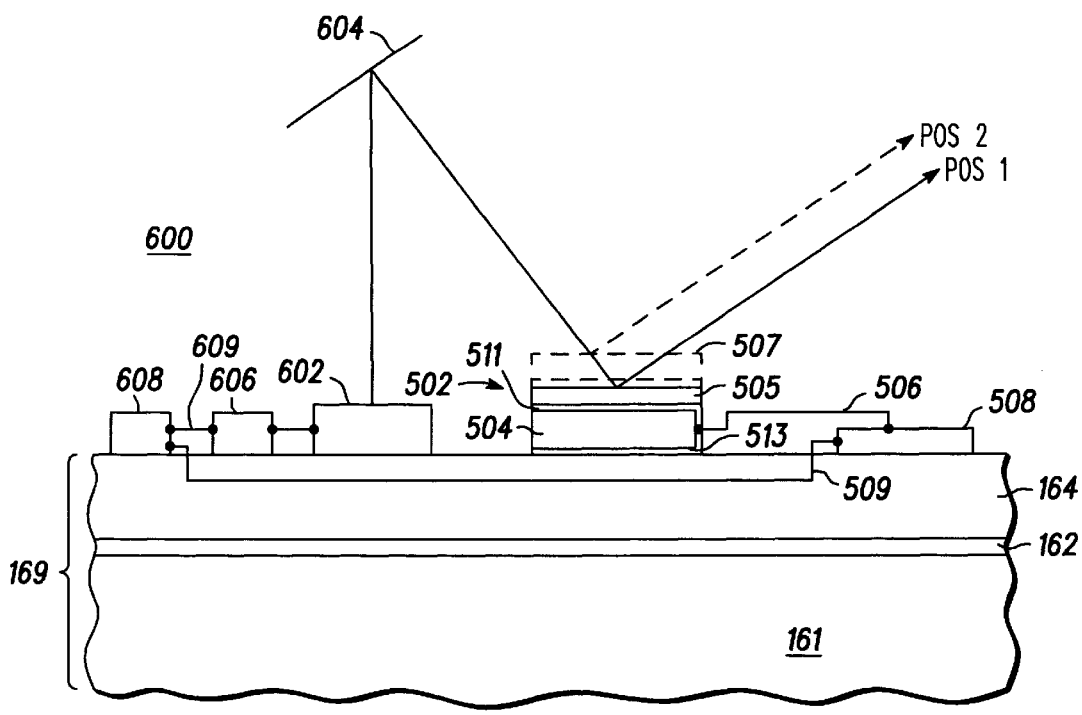
FIG. 32 illustrates schematically, in cross-section, an optical switch in accordance with another embodiment of the invention.

FIG. 32 illustrates schematically, in cross-section, an optical switch system 600 having a self-contained light source 602 in accordance with another embodiment of the invention. In this embodiment, the optical switch 600 includes the light source 602, a reflective surface 604, a source driver circuit 606, and a radio frequency (RF) circuit 608. Further, in this embodiment, the piezoelectric layer 504 is preferably GaAlAs, and is formed over the accommodating buffer layer 164.

The light source 602 can be a light-emitting semiconductor component, including an LED or semiconductor laser, such as a vertical cavity surface emitting laser (VCSEL), edge emitting laser (with reflector), or the like, formed using a compound semiconductor material overlying the layer 164, such as those materials previously described herein.

Light emitted by the light source 602 is reflected onto the reflective layer 505 by the reflective surface 604 positioned above the light source 602. The reflective surface 604 can be any suitable mirror for reflecting light. The switching element 502 operates in a manner similar to that previously discussed in connection with FIG. 31.

The source driver circuit 606 includes circuitry suitable for driving and controlling the light source 602, and can include integrated circuit components fabricated on the structure 169, such as those previously described in connection with FIGS. 24–30. In addition, the circuitry can be formed wholly or partially in the compound semiconductor material and/or the monocrystalline substrate 161, as shown FIG. 31.

The RF circuit 608 can be advantageously fabricated using Group III–V materials integrally formed overlying the layer 164. The RF circuit 608 can include an RF receiver circuit for receiving RF signals from an external source for remotely controlling the operation of the lighting source 602 and the switching element 502. The RF signals can carry an on/off command for the switch 600, or a position command for setting the switch element 502 to a specified one of a plurality of positions. The RF circuit is electrically coupled to the driver circuits 606, 508 by conductors 609,509, respectively.

Figure 33:
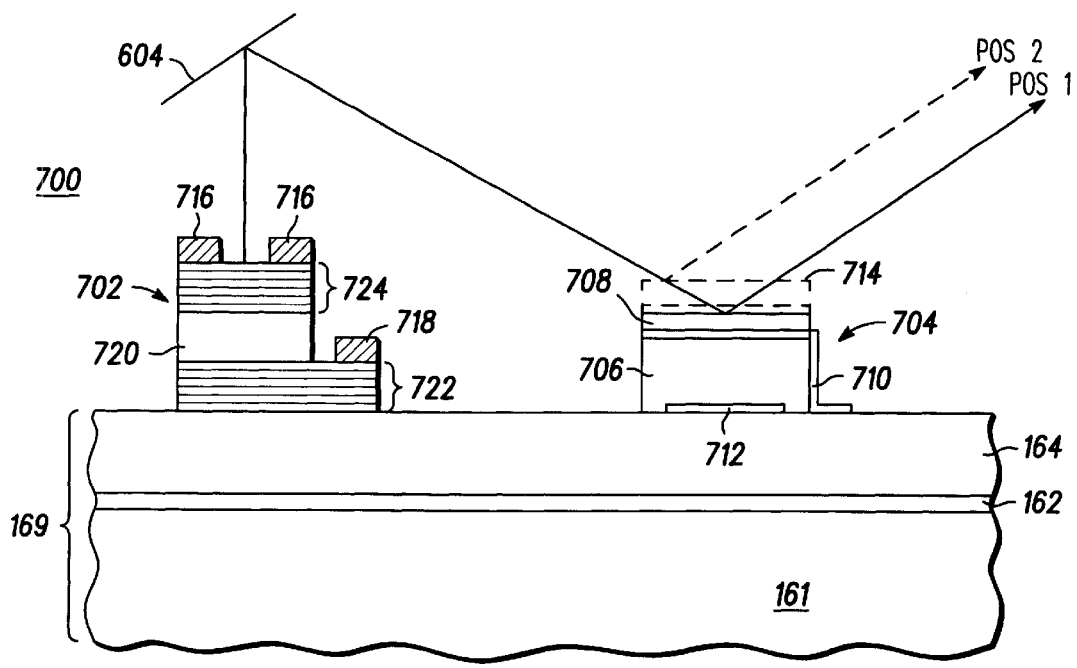
FIG. 33 illustrates schematically, in cross-section, an optical switch in accordance with a further embodiment of the invention.

FIG. 33 illustrates schematically, in cross-section, an optical switching system 700 in accordance with a further embodiment of the invention. The optical switch 700 includes a VCSEL 702 and a light switch element 704 formed on the semiconductor device structure 169. The optical switch 700 operates in a manner similar to that previously described for the switches shown in FIGS. 31–32.

The layers needed to form the optical laser 702 can be formed first. In FIG. 33, the lower mirror layer 722 includes alternating layers of compound semiconductor materials. For example, the first, third, and fifth films within the optical laser may include a material such as gallium arsenide, and the second, fourth, and sixth films within the lower mirror layer 722 may include gallium aluminum arsenide or vice versa. Layer 720 includes the active region that is used for photon generation. Upper mirror layer 724 is formed in a similar manner to the lower mirror layer 722 and includes alternating films of compound semiconductor materials. In one particular embodiment, the upper mirror layer 724 may be p-type doped compound semiconductor materials, and the lower mirror layer 722 may be n-type doped compound semiconductor materials. Additional steps can be performed to define the upper mirror layer 724 and active layer 720 of the optical laser 702. The sides of the upper mirror layer 724 and active layer 722 are substantially coterminous.

Contacts 716 and 718 are formed for making electrical contact to the upper mirror layer 170 and the lower mirror layer 166, respectively, as shown in FIG. 33. Contact 716 has an annular shape to allow light (photons) to pass out of the upper mirror layer 724.

The light switching element 704 includes a piezoelectric layer 706 and a reflective layer 708, such as those previously described herein. The reflective layer 708 moves to an active position 714 as a result of an electric field being applied to the piezoelectric layer 706 via conductors (electrodes) 710 and 712. The conductor 710 can be metallic conductor or a monocrystalline oxide material as described previously. The lower conductor 712 can be a conductive monocrystalline oxide suitable for subsequent growth of overlying monocrystalline piezoelectric material. Monocrystalline conductive oxides include strontium ruthenate, strontium vanadate, and $(La,Sr)CoO_3$. Sputter deposition techniques may be used to form the conductive monocrystalline oxides. RF Magnetron Sputtering, in particular, can be used to deposit the monocrystalline layer of $(La,Sr)CoO_3$. Alternatively, such monocrystalline oxides can include lanthanum nickel oxide (LNO). Driver and RF circuits, as previously described, can be included in the optical switch 700 to operated the VCSEL 702 and switching element 704.

Figure 34:
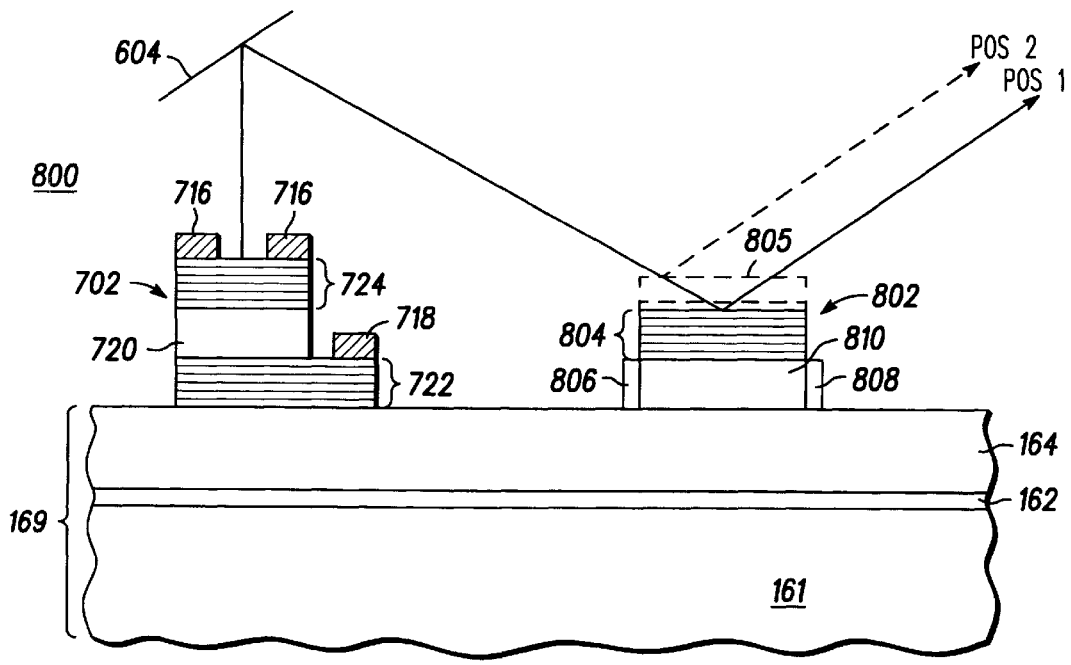
FIG. 34 illustrates schematically, in cross-section, an optical switch in accordance with yet another embodiment of the invention.

FIG. 34 illustrates schematically, in cross-section, an optical switch system 800 in accordance with yet another embodiment of the invention. In this embodiment, the switching element 802 includes a reflective layer 804 composed of alternating layers of compound semiconductor materials. For example, the first, third, and fifth films within the reflective layer 804 may include a material such as gallium arsenide, and the second, fourth, and sixth films within the layer 804 may include gallium aluminum arsenide or vice versa. This structure permits the reflective layer 804 to be formed using the same layers as either the upper or lower mirrors 724,722 in the VCSEL 702. The reflective layer 804 is movable to an active position 805 when an electric field is applied across a piezoelectric layer 810.

To apply voltage to the piezoelectric layer 810, a pair of contacts 806,808 are formed along opposing vertical surfaces of the piezoelectric material. The contacts 806,808 can be metallic conductors formed using any suitable metal deposition technique. The optical switching system 800 can include driver and RF circuits similar to that previously discussed in connection with FIG. 32.

Figure 35:
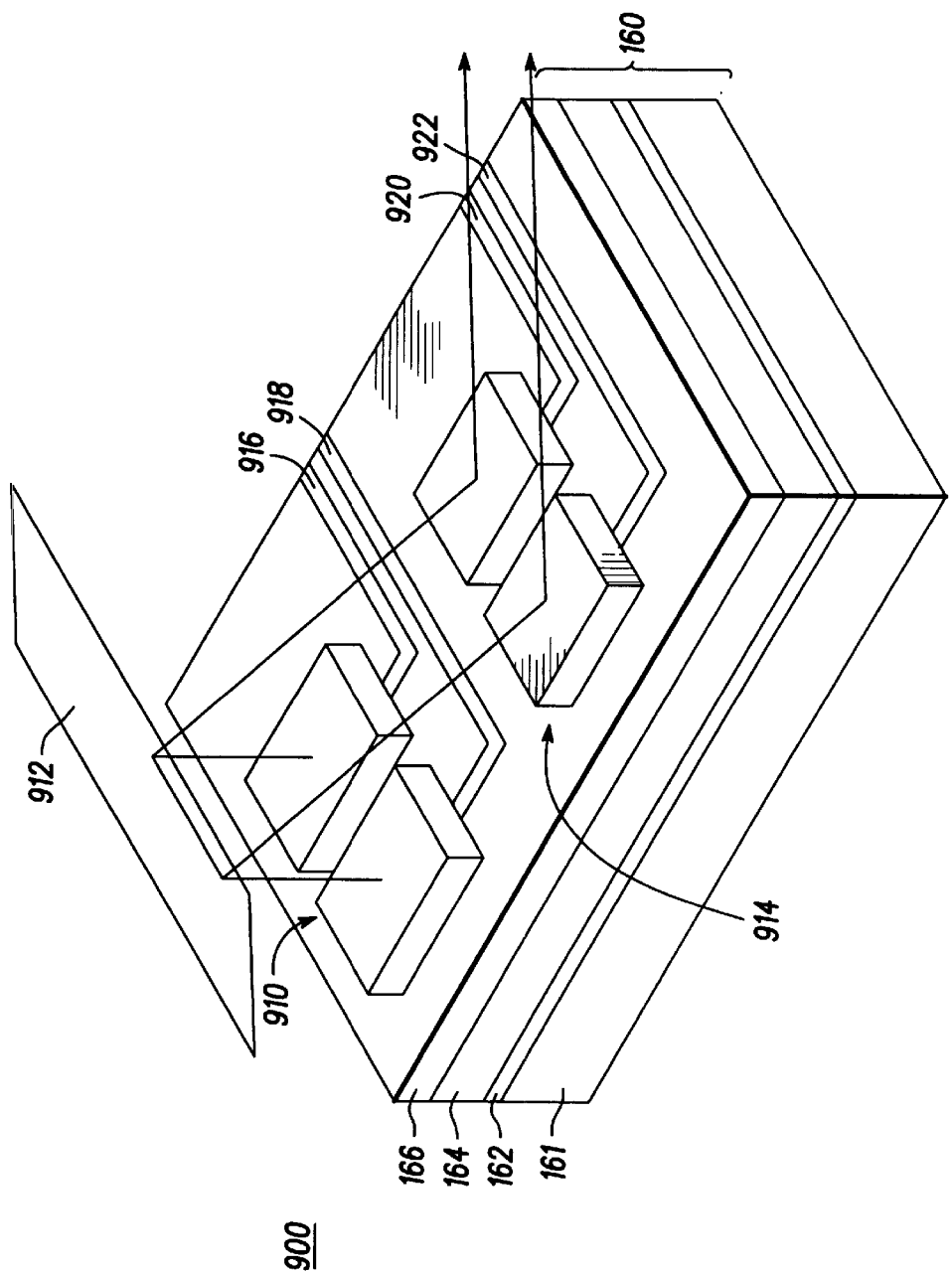
FIG. 35 illustrates a perspective view of an optical switching array in accordance with another embodiment of the invention.

FIG. 35 illustrates a perspective view of an exemplary optical switching array 900 in accordance with another embodiment of the invention. The array 900 includes plural light sources 910 and plural light switching elements 914 formed on the semiconductor device structure 160. Although FIG. 35 shows two pairs of light sources and switching elements, any number of sources and switching elements can be included in the array 910.

At least one reflective surface 912 is provided for directing the light from the light sources 910 to corresponding ones of the light switches 914. The light sources 910 and switching elements 914 can include any of those previously described herein. Also, driver and RF circuitry (not shown) can be included in the array 910.

Each of the light sources 910 and switching elements 914 are independently addressable using conductors 916–922. Thus, the light sources 910 and switching elements 914 can be individually operated using appropriate command signals.

Figure 36:
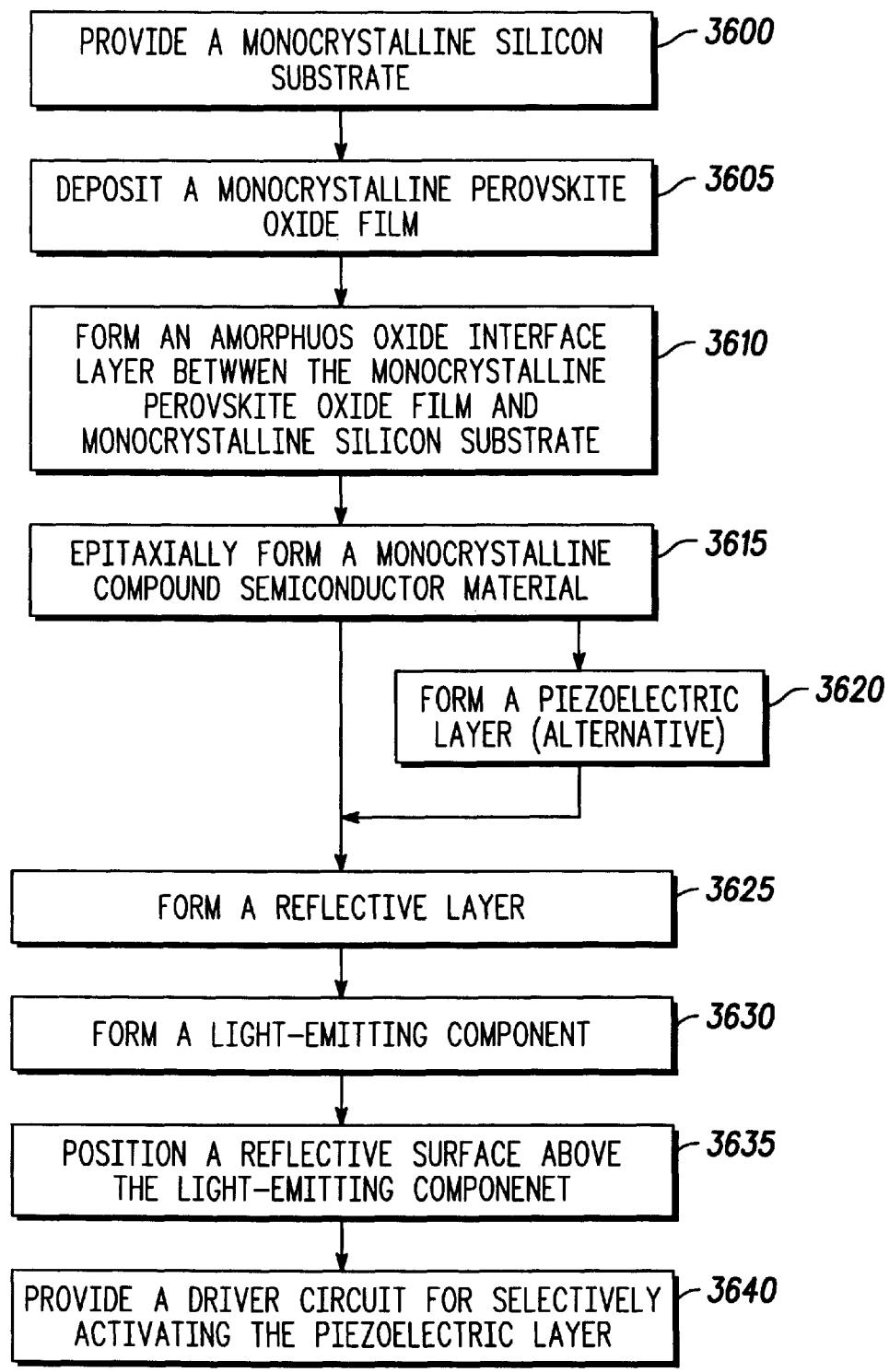
FIG. 36 illustrates schematically a flowchart or processes for fabricating a structure for an optical switch.

FIG. 36 is a flow chart of processes for fabricating a structure for an optical switch. Some steps, including steps that are obvious to one of ordinary skill in the art, are not shown. At step 3600, a monocrystalline substrate is provided, meaning that the substrate is prepared for use in equipment that can perform the next process step. The monocrystalline substrate is preferably silicon. A monocrystalline perovskite oxide film overlying the monocrystalline silicon substrate is deposited at step 3605, the film having a thickness less than a thickness of the material that would result in strain-induced defects. At step 3610, an amorphous oxide interface layer containing at least silicon and oxygen is formed at an interface between the monocrystalline perovskite oxide film and the monocrystalline silicon substrate. A monocrystalline compound semiconductor material is epitaxially formed at step 3615 overlying the monocrystalline perovskite oxide material. In one method, the monocrystalline compound semiconductor material formed at step 3615 provides a piezoelectric layer. In an alternative method, a piezoelectric layer is formed over the monocrystalline compound semiconductor material at optional step 3620. A reflective layer overlying the piezoelectric layer is formed at step 3625. In accordance with the alternative method, a light-emitting component is formed at step 3630 using the monocrystalline compound semiconductor material, and a reflective surface is positioned above the light-emitting component at step 3635 to direct light from the light-emitting component onto the reflective layer. In both methods, a driver circuit is provided at step 3640 for selectively activating the piezoelectric layer to alter the position of the reflective layer in order to alter the path of the light reflected by the reflective layer.

Those embodiments specifically describing structures having compound semiconductor portions and Group IV semiconductor portions are meant to illustrate embodiments of the present invention and not limit the present invention. There are a multiplicity of other combinations and other embodiments of the present invention. For example, the present invention includes structures and methods for fabricating material layers that form semiconductor structures, devices and integrated circuits including other layers such as metal and non-metal layers. More specifically, the invention includes structures and methods for forming a compliant substrate that is used in the fabrication of semiconductor structures, devices and integrated circuits and the material layers suitable for fabricating those structures, devices, and integrated circuits. By using the various device structures, it is now simpler to integrate devices that include monocrystalline layers comprising semiconductor and compound semiconductor materials as well as other material layers that are used to form those devices with other components that work better or are easily and/or inexpensively formed within semiconductor or compound semiconductor materials. This allows a device to be shrunk, the manufacturing costs to decrease, and yield and reliability to increase.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

We claim:

1. A structure for providing a light switch, comprising:
   a monocrystalline silicon substrate;
   an amorphous oxide material overlying the monocrystalline silicon substrate;
   a monocrystalline perovskite oxide material overlying the amorphous oxide material;
   a monocrystalline compound semiconductor material for supporting a piezoelectric layer overlying the monocrystalline perovskite oxide material;
   a reflective material, overlying the piezoelectric layer, for reflecting light; and
   a driver circuit for selectively activating the piezoelectric layer to alter a path of the light reflected by the reflective material.

2. The structure of claim 1, further comprising:
   a light source for generating the light incident upon the reflective material.

3. The structure of claim 2, wherein the light source is formed using the monocrystalline compound semiconductor material.

4. The structure of claim 3, wherein the light source is selected from the group consisting of a vertical cavity surface emitting laser, an edge emitting laser, and a light emitting diode (LED).

5. The structure of claim 1, further comprising:
   a reflective surface, positioned above the reflective material, for directing light onto the reflective material.

6. The structure of claim 1, further comprising a first conductor formed on top of the piezoelectric layer and a second conductor formed under the piezoelectric layer.

7. The structure of claim 1, further comprising at least two conductors formed along at least two substantially vertical surfaces of the piezoelectric layer.

8. The structure of claim 1, wherein the monocrystalline compound semiconductor material thickness is between 5 $\mu$m and 100 $\mu$m.

9. The structure of claim 1, wherein the compound semiconductor material used to form the piezoelectric layer is selected from the group consisting of gallium arsenide and gallium aluminum arsenide.

10. The structure of claim 1, wherein the reflective material is epitaxially grown on the piezoelectric layer.

11. The structure of claim 1, wherein the reflective material is attached to the piezoelectric layer using an adhesive.

12. The structure of claim 1, wherein the reflective material is sputter deposited on the piezoelectric layer.

13. The structure of claim 1, further comprising a radio frequency (RF) circuit, operatively coupled to the driver circuit, for activating the piezoelectric layer in response to an RF signal.

14. The structure of claim 1, wherein the material used to form the piezoelectric layer is selected from the group consisting of barium titanate, lead titanate, potassium niobate, lead niobate, and lead zirconate titanate.

15. A system for an optical switch, comprising:

a monocrystalline silicon substrate;

an amorphous oxide material overlying the monocrystalline silicon substrate;

a monocrystalline perovskite oxide material overlying the amorphous oxide material;

a monocrystalline compound semiconductor material overlying the monocrystalline perovskite oxide material;

a piezoelectric layer overlying the monocrystalline compound semiconductor material;

a reflective material overlying the piezoelectric layer;

a light-emitting component formed using the monocrystalline compound semiconductor material;

a reflective surface positioned above the light-emitting component for directing light from the light-emitting component onto the reflective material; and a driver circuit for selectively activating the piezoelectric layer to alter the position of the reflective material in order to alter the path of the light reflected by the reflective material.

16. The system of claim 15, wherein the light-emitting component is selected from the group consisting of a vertical cavity surface emitting laser, an edge emitting laser, and a light emitting diode (LED).

17. The system of claim 15, wherein the material used to form the piezoelectric layer is selected from the group consisting of gallium arsenide and gallium aluminum arsenide.

18. The system of claim 15, wherein the reflective material is epitaxially grown on the piezoelectric layer.

19. The system of claim 15, wherein the reflective material is attached to the piezoelectric layer using an adhesive.

20. The system of claim 15, wherein the reflective material is sputter deposited on the piezoelectric layer.

21. The system of claim 15, further comprising a radio frequency (RF) circuit, operatively coupled to the driver circuit, for activating the piezoelectric layer in response to an RF signal.

22. The system of claim 15, further comprising a first conductor formed on top of the piezoelectric layer and a second conductor formed under the piezoelectric layer.

23. The system of claim 15, further comprising at least two conductors formed along at least two substantially vertical surfaces of the piezoelectric layer.

24. The system of claim 15, wherein the material used to form the piezoelectric layer is selected from the group consisting of barium titanate, lead titanate, potassium niobate, lead niobate, and lead zirconate titanate.

25. An optical switching system, comprising:

a monocrystalline silicon substrate;

an amorphous oxide material overlying the monocrystalline silicon substrate;

a monocrystalline perovskite oxide material overlying the amorphous oxide material;

a monocrystalline compound semiconductor material overlying the monocrystalline perovskite oxide material;

a plurality of piezoelectric regions overlying the monocrystalline compound semiconductor material;

a plurality of reflective surfaces overlying the plurality of piezoelectric regions;

a plurality of light-emitting components corresponding to the plurality of reflective surfaces, formed using the monocrystalline compound semiconductor material;

at least one mirror positioned above the plurality of light-emitting components for directing a plurality of light beams from the plurality of light-emitting components onto the plurality of reflective surfaces; and means for selectively activating each of the plurality of piezoelectric regions to independently alter the positions of the plurality of reflective surfaces in order to alter the paths of the plurality of light beams reflected by the plurality of reflective surfaces.

26. The system of claim 25, wherein at least one of the light-emitting components is selected from the group consisting of a vertical cavity surface emitting laser, an edge emitting laser, and a light emitting diode (LED).

27. The system of claim 25, wherein the material used to form the plurality of piezoelectric regions is selected from the group consisting of gallium arsenide and gallium aluminum arsenide.

28. The system of claim 25, further comprising a radio frequency (RF) circuit for activating at least one of the piezoelectric regions in response to an RF signal.

29. The system of claim 25, wherein the material used to form the plurality of piezoelectric regions is selected from the group consisting of barium titanate, lead titanate, potassium niobate, lead niobate, and lead zirconate titanate.

30. A process for fabricating a structure for an optical switch, comprising:

providing a monocrystalline silicon substrate;

depositing a monocrystalline perovskite oxide film overlying the monocrystalline silicon substrate, the film having a thickness less than a thickness of the material that would result in strain-induced defects;

forming an amorphous oxide interface layer containing at least silicon and oxygen at an interface between the monocrystalline perovskite oxide film and the monocrystalline silicon substrate;

epitaxially forming a monocrystalline compound semiconductor material for providing a piezoelectric layer overlying the monocrystalline perovskite oxide material;

forming a reflective layer, overlying the piezoelectric layer, for reflecting light; and providing a driver circuit for selectively activating the piezoelectric layer to alter a path of the light reflected by the reflective layer.

31. The process of claim 30, further comprising:

forming a first conductor on top of the piezoelectric layer; and forming a second conductor under the piezoelectric layer.

32. The process of claim 30, further comprising:

forming at least two conductors along at least two substantially vertical surfaces of the piezoelectric layer.

33. The process of claim 30, wherein the material used to form the piezoelectric layer is selected from the group consisting of gallium arsenide, gallium aluminum arsenide, barium titanate, lead titanate, potassium niobate, lead niobate, and lead zirconate titanate.

34. The process of claim 30, wherein the step of forming the reflective layer includes epitaxially growing the reflective layer on the piezoelectric layer.

35. The process of claim 30, wherein the step of forming the reflective layer includes attaching the reflective layer to the piezoelectric layer using an adhesive.

36. The process of claim 30, further comprising:

providing a radio frequency (RF) circuit, operatively coupled to the driver circuit, for activating the piezoelectric layer in response to an RF signal.

37. A process for fabricating a structure for an optical switch, comprising:

providing a monocrystalline silicon substrate;

depositing a monocrystalline perovskite oxide film overlying the monocrystalline silicon substrate, the film having a thickness less than a thickness of the material that would result in strain-induced defects;

forming an amorphous oxide interface layer containing at least silicon and oxygen at an interface between the monocrystalline perovskite oxide film and the monocrystalline silicon substrate;

epitaxially forming a monocrystalline compound semiconductor material overlying the monocrystalline perovskite oxide material;

forming a piezoelectric layer over the monocrystalline compound semiconductor material;

forming a reflective layer overlying the piezoelectric layer;

forming a light-emitting component using the monocrystalline compound semiconductor material;

positioning a reflective surface above the light-emitting component to direct light from the light-emitting component onto the reflective layer; and providing a driver circuit for selectively activating the piezoelectric layer to alter the position of the reflective layer in order to alter the path of the light reflected by the reflective layer.

38. The process of claim 37, wherein the light-emitting component is selected from the group consisting of a vertical cavity surface emitting laser, an edge emitting laser, and a light emitting diode (LED).

39. The process of claim 37, further comprising:

forming a first conductor on top of the piezoelectric layer; and forming a second conductor under the piezoelectric layer.

40. The process of claim 37, further comprising:

forming at least two conductors along at least two substantially vertical surfaces of the piezoelectric layer.

41. The process of claim 37, wherein the piezoelectric layer includes material selected from the group consisting of gallium arsenide, gallium aluminum arsenide, barium titanate, lead titanate, potassium niobate, lead niobate, and lead zirconate titanate.

42. The process of claim 37, wherein the step of forming the reflective layer includes epitaxially growing the reflective layer on the piezoelectric layer.

43. The process of claim 37, wherein the step of forming the reflective layer includes attaching the reflective layer to the piezoelectric layer using an adhesive.

44. The process of claim 37, further comprising:

providing a radio frequency (RF) circuit, operatively coupled to the driver circuit, for activating the piezoelectric layer in response to an RF signal.

* * * * *